(12) United States Patent
Whetsel

(10) Patent No.: US 6,678,188 B2
(45) Date of Patent: Jan. 13, 2004

(54) QUAD STATE MEMORY DESIGN METHODS, CIRCUITS, AND SYSTEMS

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 09/767,417

(22) Filed: Jan. 22, 2001

(65) Prior Publication Data
US 2001/0038550 A1 Nov. 8, 2001

(51) Int. Cl.[7] .............................................. G11C 11/00
(52) U.S. Cl. ........................ 365/168; 365/154; 365/233
(58) Field of Search ............................ 365/168, 185.03, 365/233, 154

(56) References Cited

U.S. PATENT DOCUMENTS 6,181,603 B1 * 1/2001 Jyouno et al. ......... 365/185.03
6,215,728 B1 * 4/2001 Yamada ...................... 365/168

* cited by examiner

*Primary Examiner*—Richard Elms
*Assistant Examiner*—Jung H. Hur
(74) *Attorney, Agent, or Firm*—Yingsheng Tung; Wade James Brady, III; Frederick J. Telecky, Jr.

(57) ABSTRACT

As the number of signaling wires increase in integrated circuits, power consumption, related to charging and discharging of wiring capacitance also increases and emerges as a serious obstacle to the advancement of semiconductor technology. The present invention provides a novel quad-state memory element which can be used as a fundamental building block for designing high speed, high density, and low power integrated circuits.

3 Claims, 20 Drawing Sheets

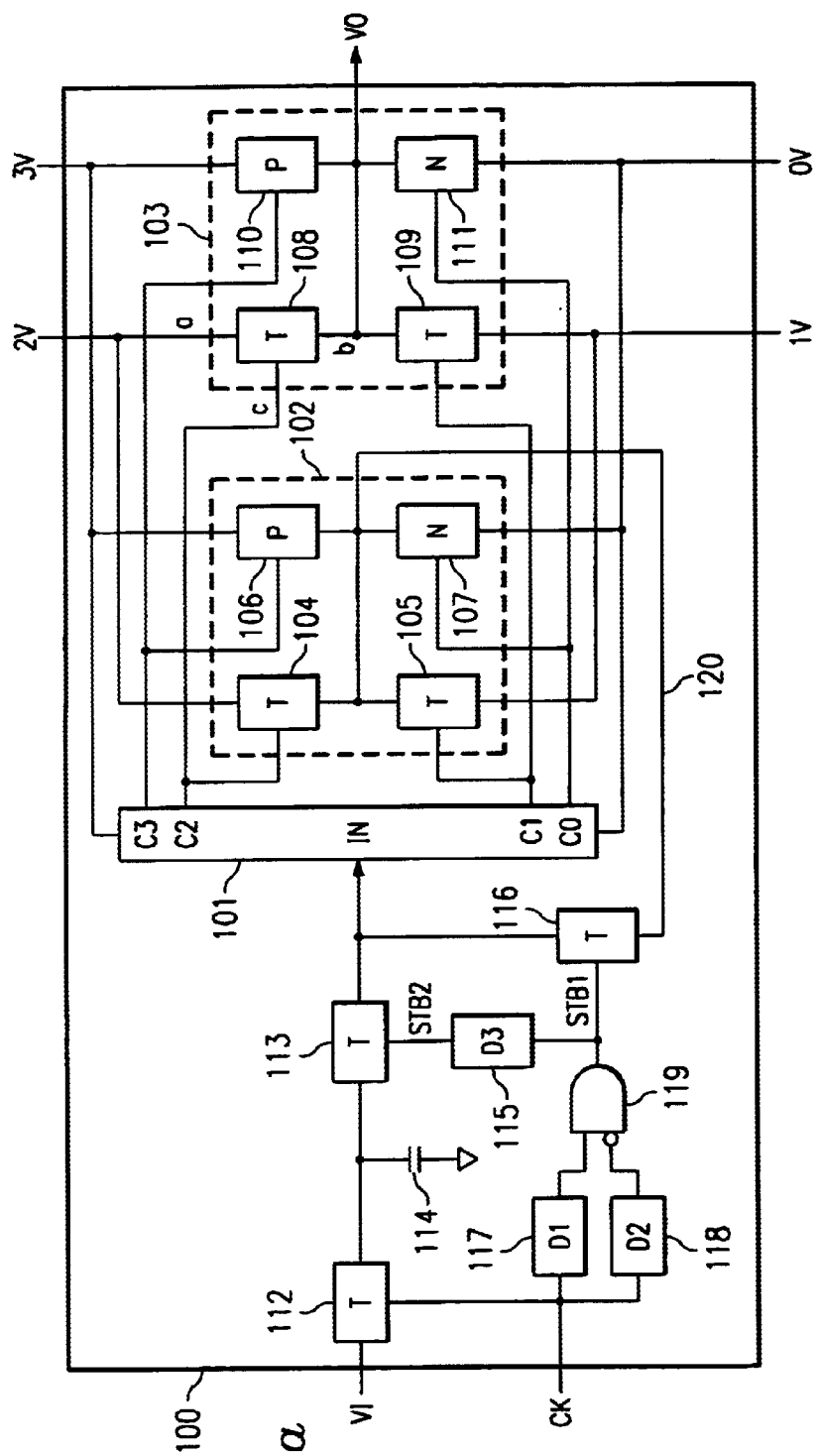
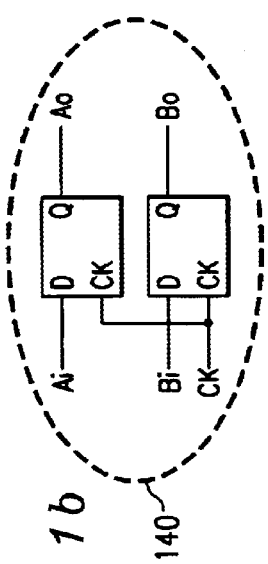
FIG. 1a
FIG. 1b
FIG. 1c

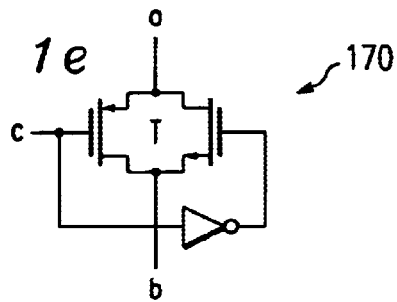
FIG. 1d
FIG. 1e
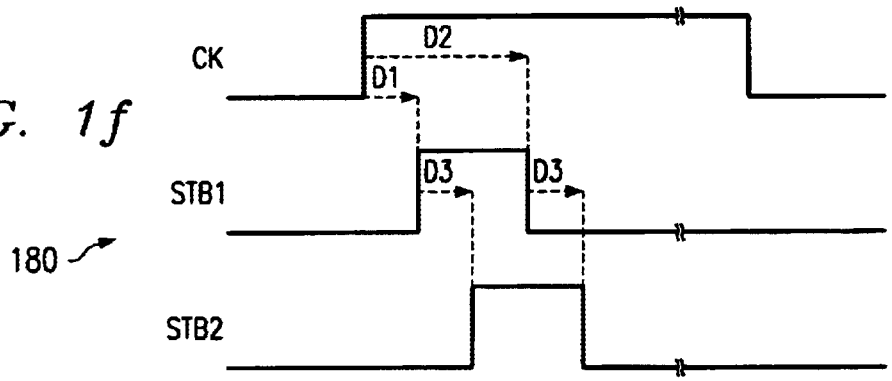
FIG. 1f
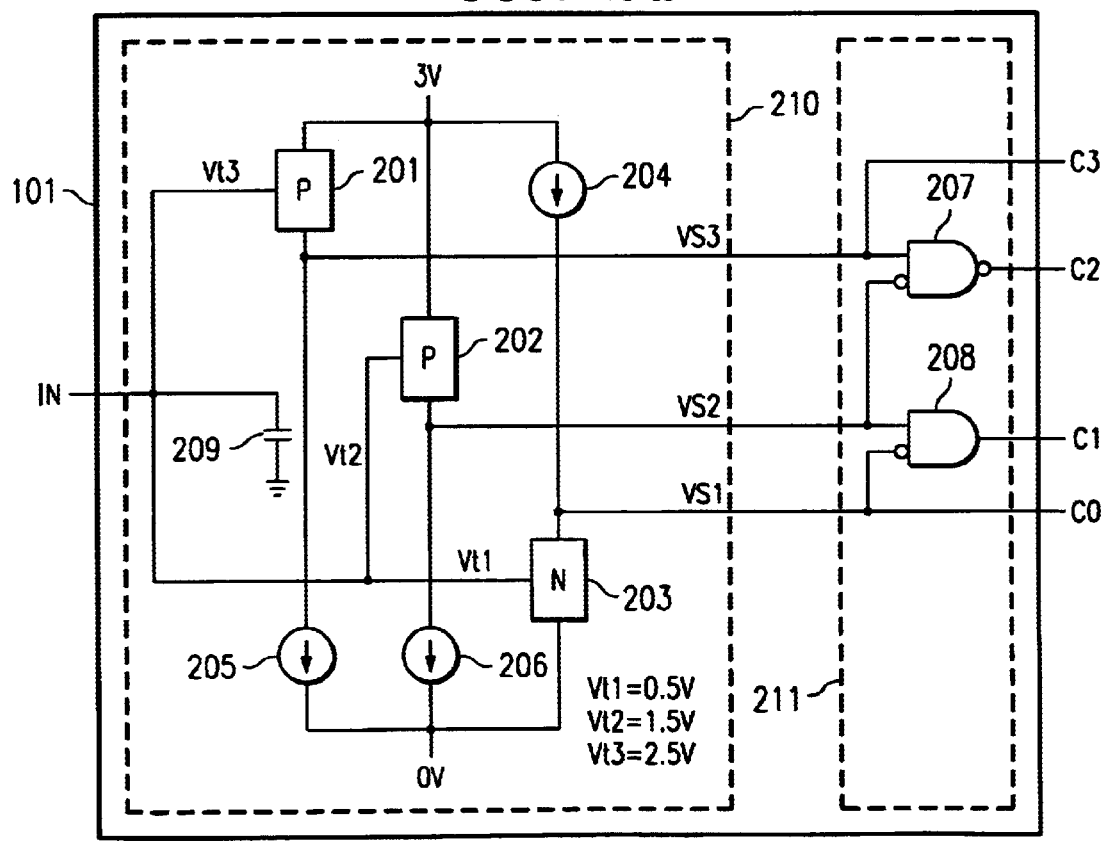
FIG. 2a

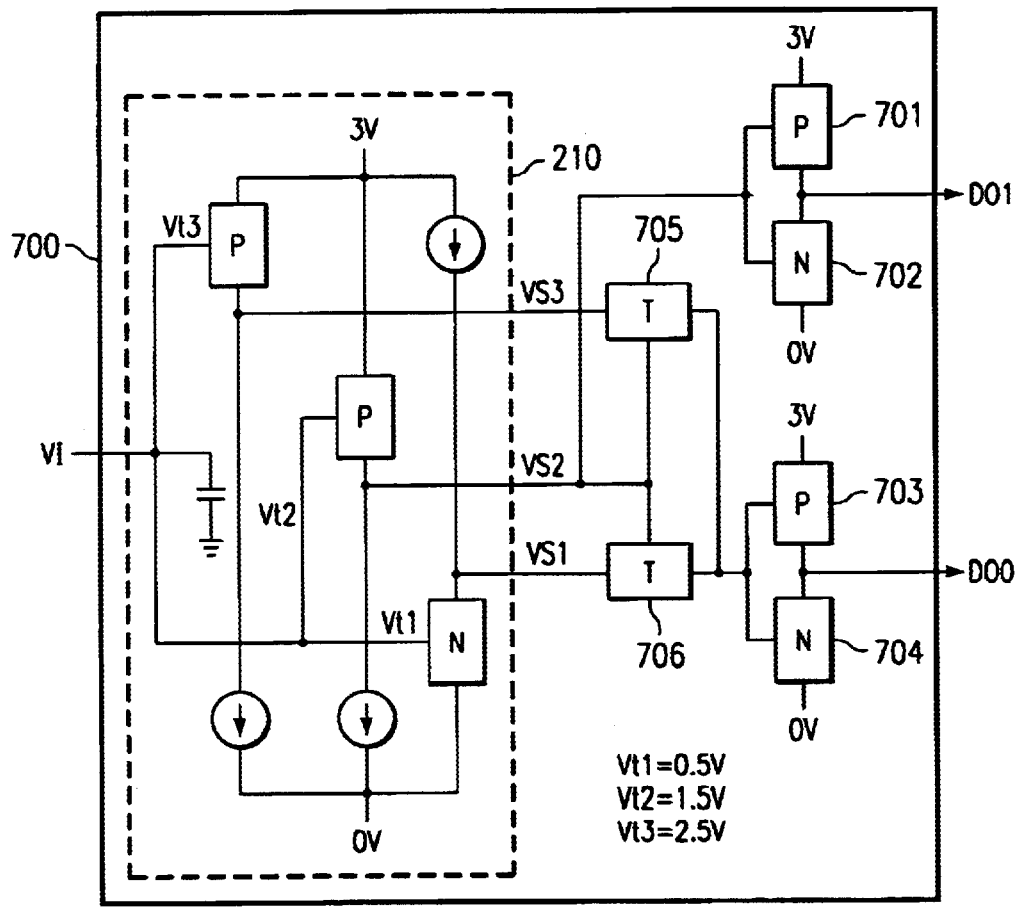

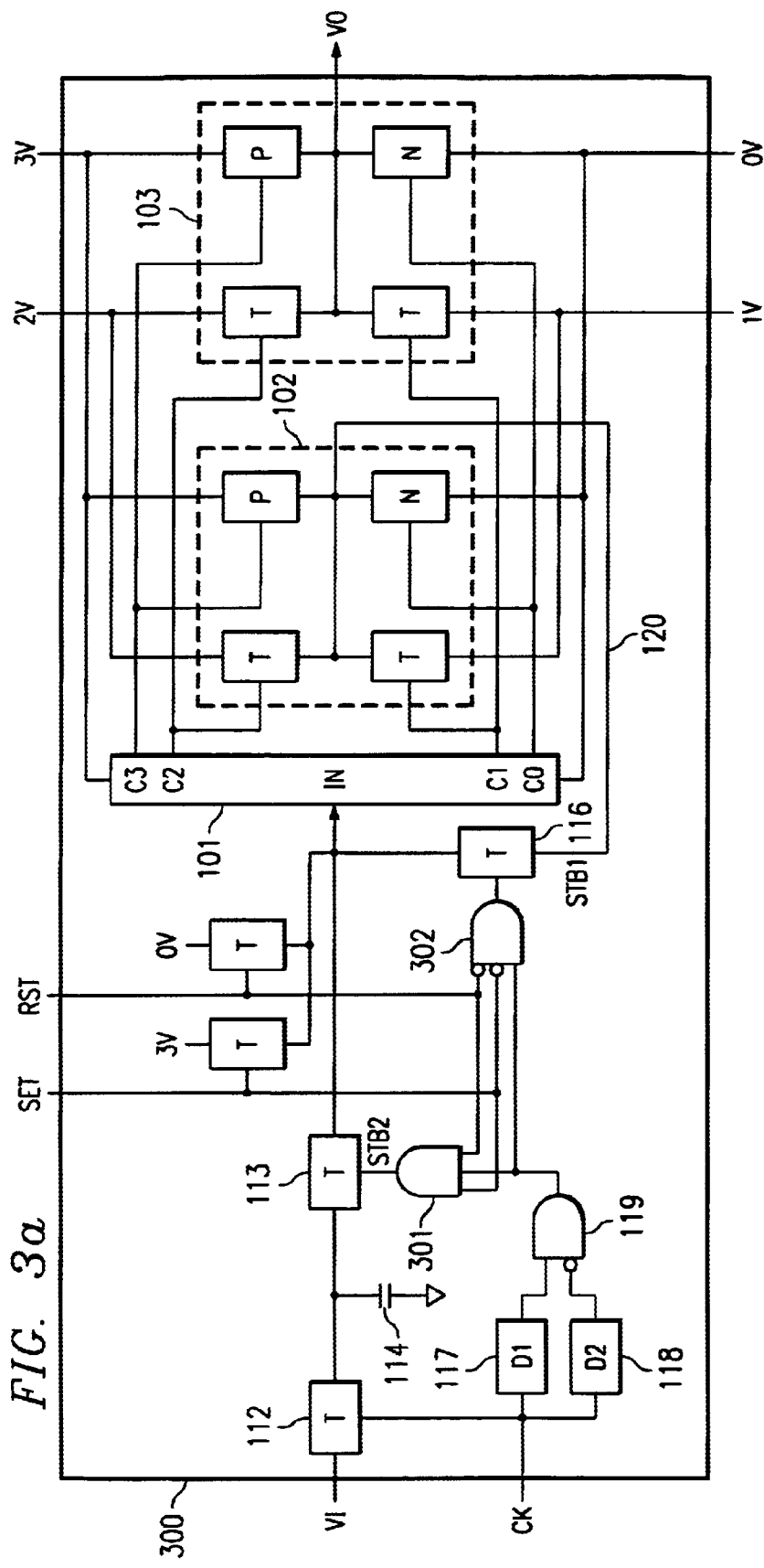
FIG. 3a
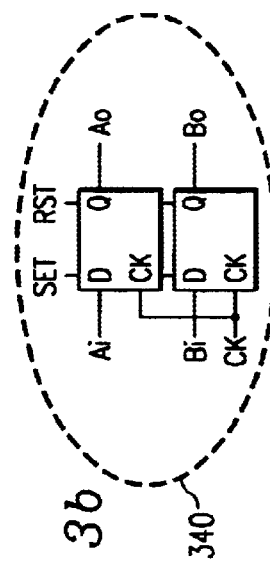
FIG. 3c
FIG. 3b

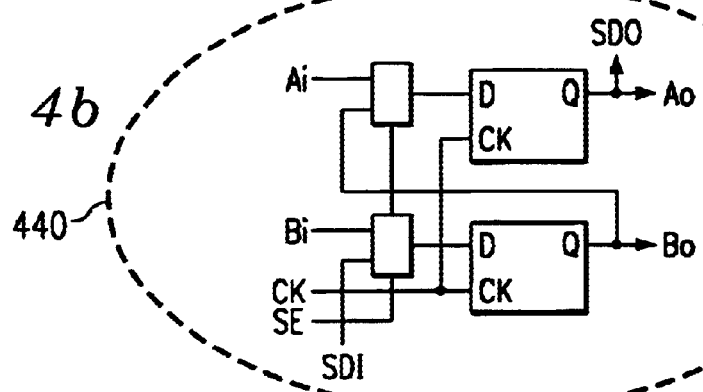
FIG. 4b
| SE | SVI | VI | CK | VO/SVO | B:A |
|----|-----|----|----|--------|-----|
| X | X | X | L | VO/SVO | -:- |
| 0 | X | 0 | P | 0 | L:L |
| 0 | X | 1 | P | 1 | L:H |
| 0 | X | 2 | P | 2 | H:L |
| 0 | X | 3 | P | 3 | H:H |
| 1 | 0 | X | P | 0 | L:L |
| 1 | 1 | X | P | 1 | L:H |
| 1 | 2 | X | P | 2 | H:L |
| 1 | 3 | X | P | 3 | H:H |
FIG. 4c
FIG. 4d
| SVI/VI/SVO/VO | B:A |
|---------------|-----|
| 0 | L:L |
| 1 | L:H |
| 2 | H:L |
| 3 | H:H |
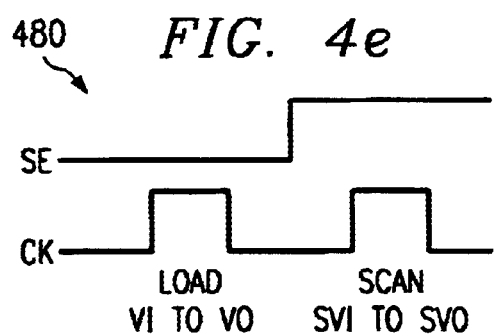
FIG. 4e

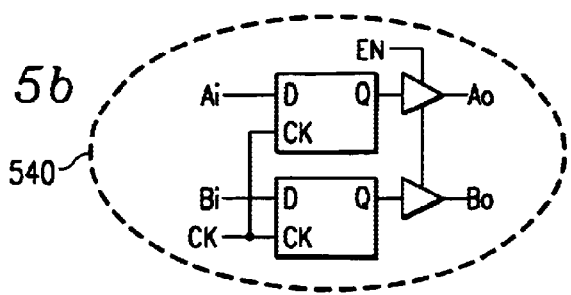
FIG. 5b
FIG. 5c
| EN | VI | CK | VOi | B:A | VO | B:A |
|----|----|----|-----|-----|----|-----|
| 0 | X | L | VO | -:- | X | Z:Z |
| 0 | 0 | P | 0 | L:L | X | Z:Z |
| 0 | 1 | P | 1 | L:H | X | Z:Z |
| 0 | 2 | P | 2 | H:L | X | Z:Z |
| 0 | 3 | P | 3 | H:H | X | Z:Z |
| 1 | X | L | VO | -:- | VO | -:- |
| 1 | 0 | P | 0 | L:L | 0 | L:L |
| 1 | 1 | P | 1 | L:H | 1 | L:H |
| 1 | 2 | P | 2 | H:L | 2 | H:L |
| 1 | 3 | P | 3 | H:H | 3 | H:H |
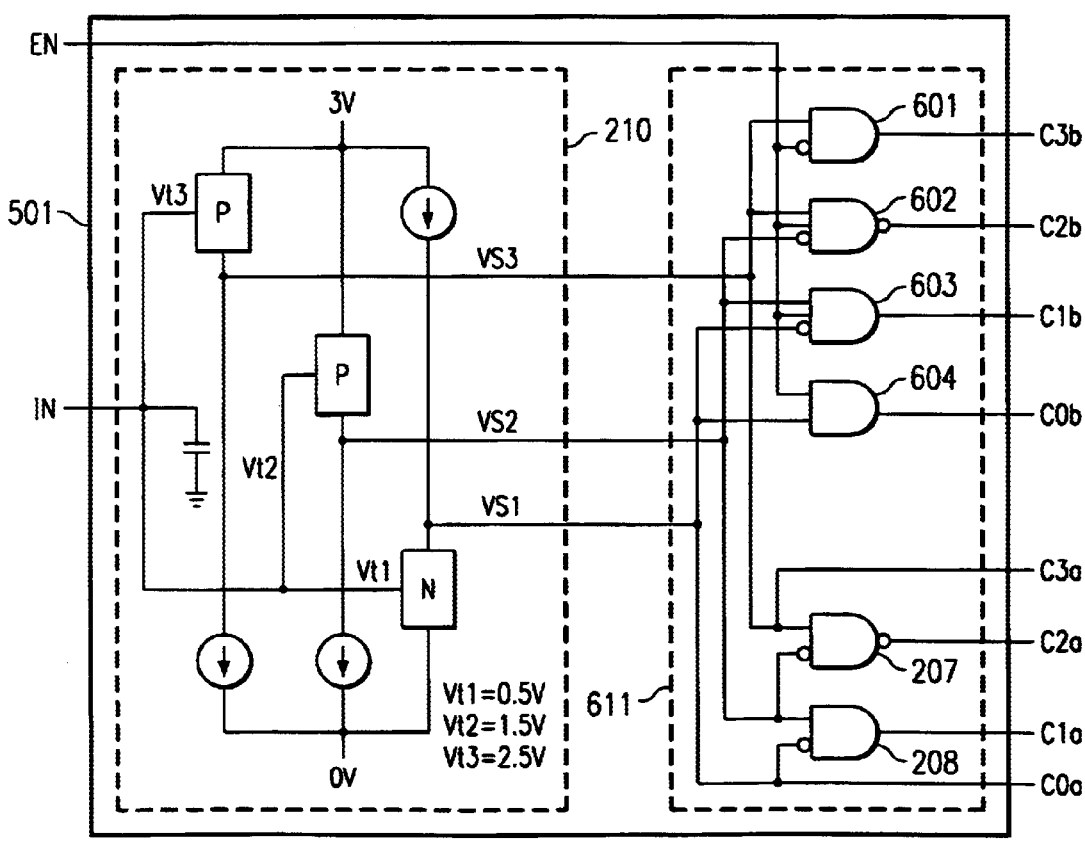
FIG. 6a

| EN | IN | VS1 | VS2 | VS3 | C0a | C1a | C2a | C3a | C0b | C1b | C2b | C3b | B:A |
|----|----|-----|-----|-----|-----|-----|-----|-----|-----|-----|-----|-----|-----|
| 0 | 0 | H | H | H | H | L | H | H | L | L | H | H | Z:Z |
| 0 | 1 | L | H | H | L | H | H | H | L | L | H | H | Z:Z |
| 0 | 2 | L | L | H | L | L | L | H | L | L | H | H | Z:Z |
| 0 | 3 | L | L | L | L | L | H | L | L | L | H | H | Z:Z |
| 1 | 0 | H | H | H | H | L | H | H | H | L | H | H | 0:0 |
| 1 | 1 | L | H | H | L | H | H | H | L | H | H | H | 0:1 |
| 1 | 2 | L | L | H | L | L | L | H | L | L | L | H | 1:0 |
| 1 | 3 | L | L | L | L | L | H | L | L | L | H | L | 1:1 |

| DI1:DI0 | C0 | C1 | C2 | C3 | VO |
|---------|----|----|----|----|----|
| L:L | H | L | H | H | 0 |
| L:H | L | H | H | H | 1 |
| H:L | L | L | L | H | 2 |
| H:H | L | L | H | L | 3 |

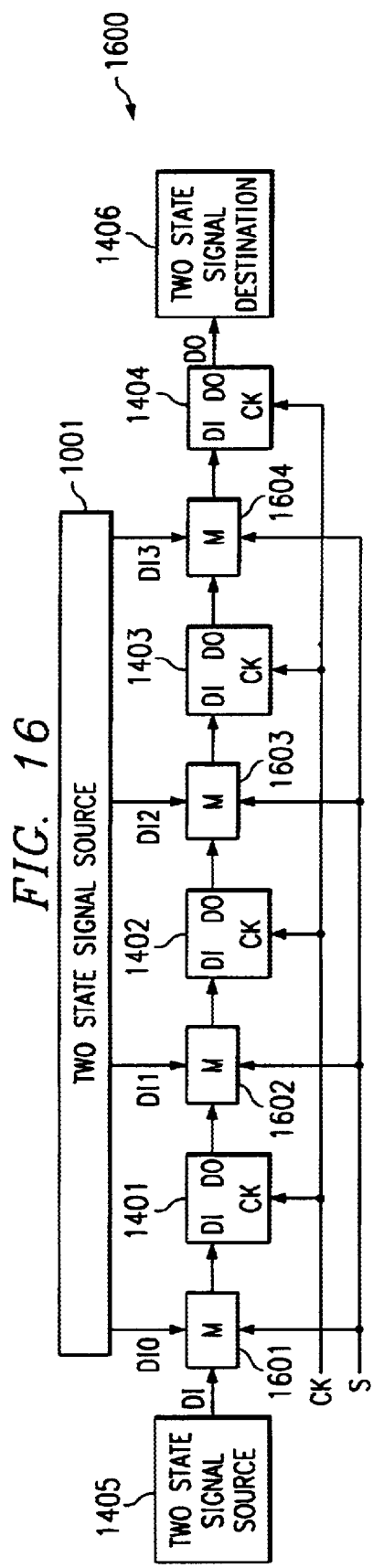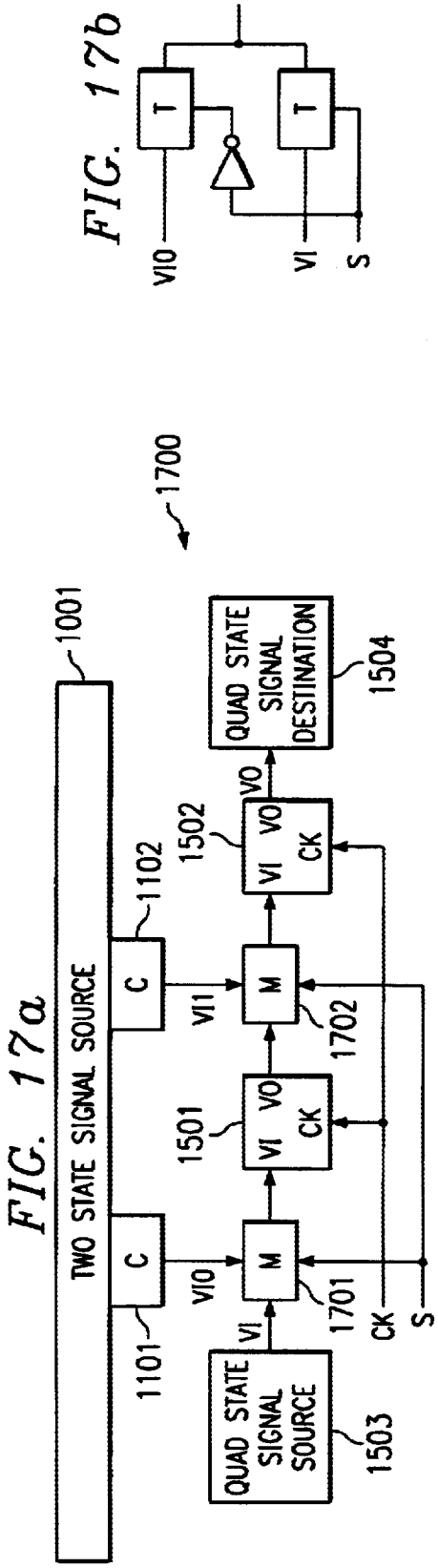

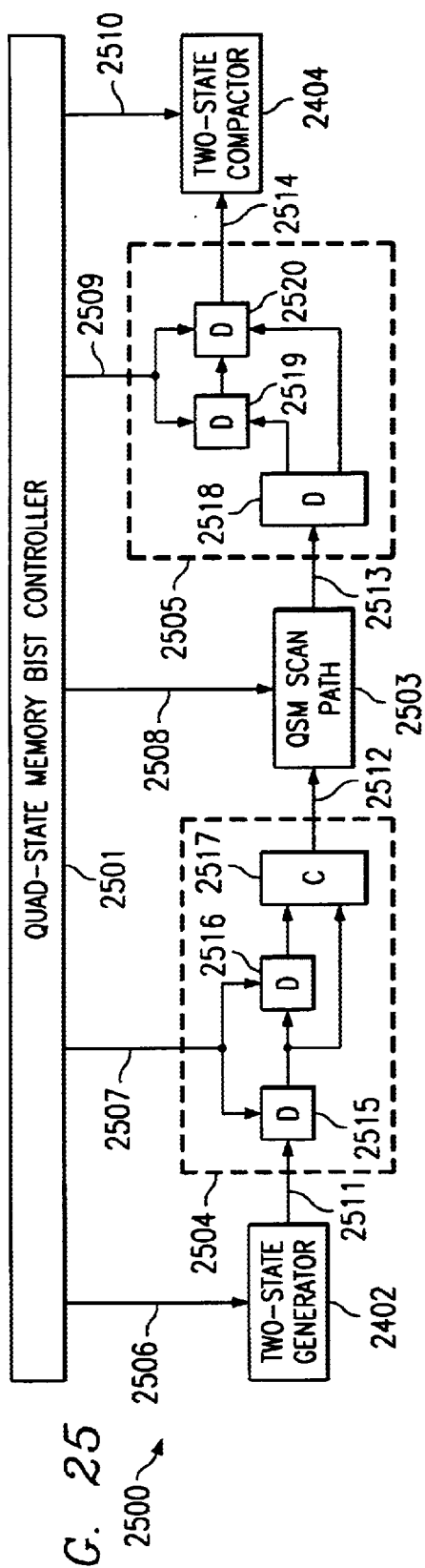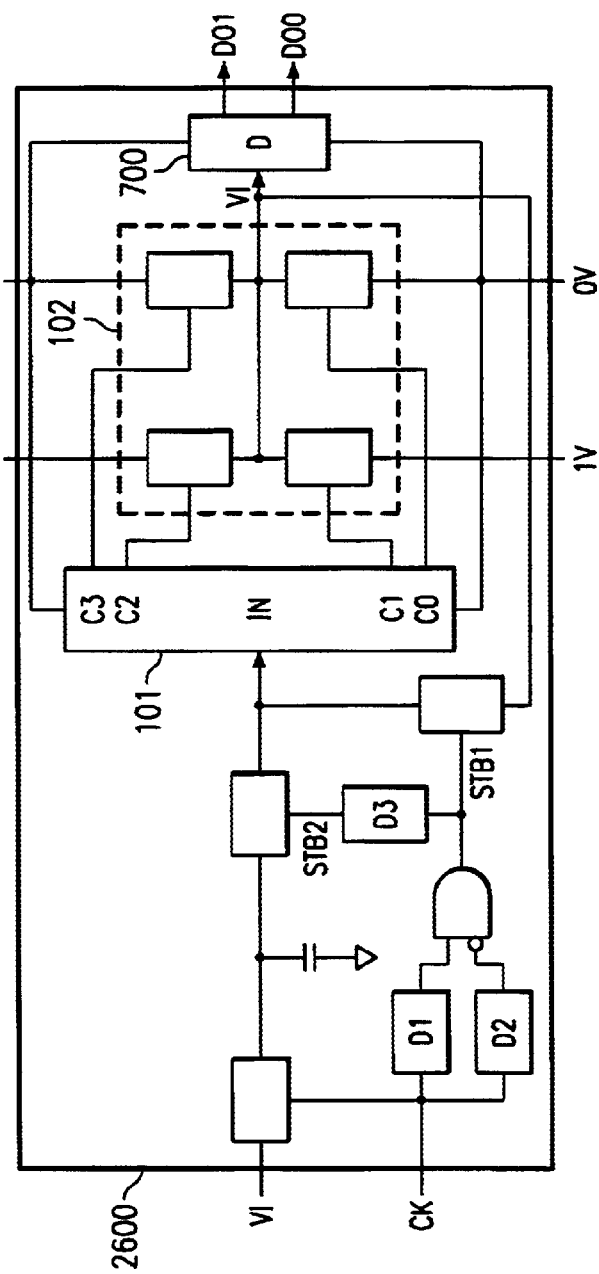

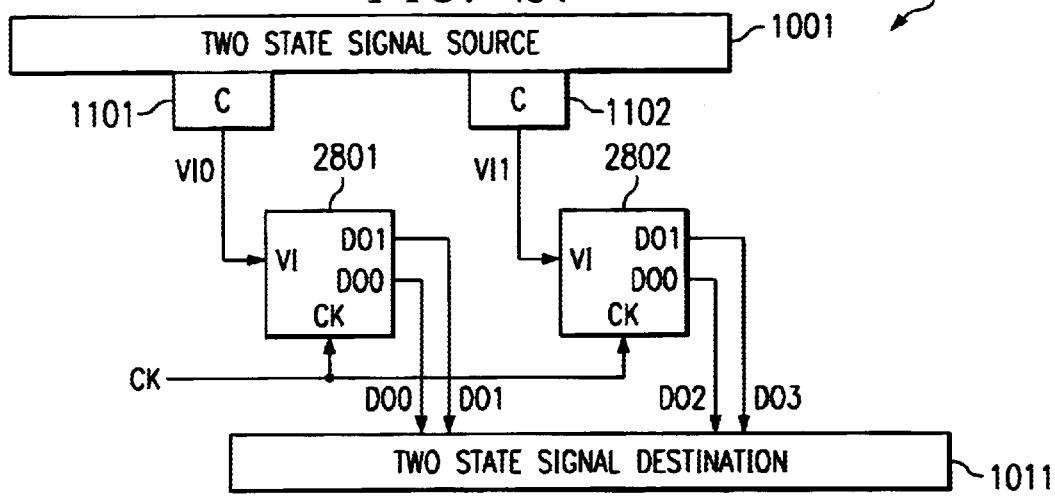
FIG. 27
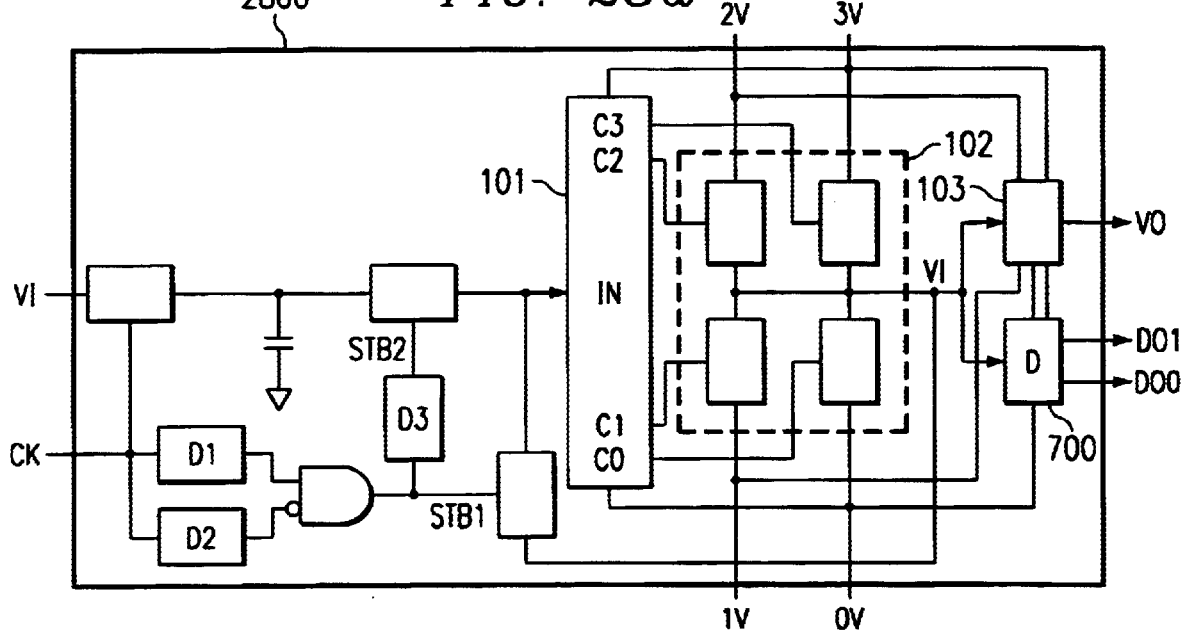
FIG. 28a
FIG. 28b
| VI | CK | VO | DO1:DO0 |
|----|----|----|---------|
| X  | L  | VO | -:-     |
| 0  | P  | 0  | L:L     |
| 1  | P  | 1  | L:H     |
| 2  | P  | 2  | H:L     |
| 3  | P  | 3  | H:H     |

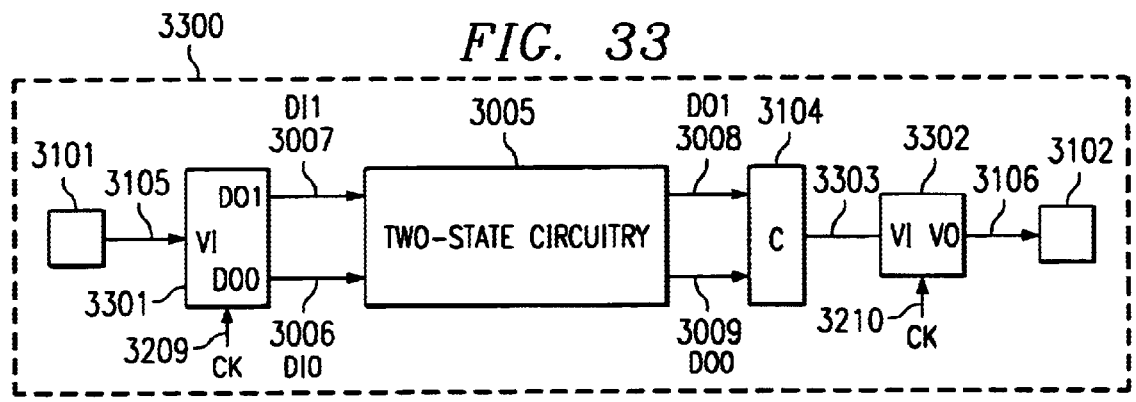
FIG. 33
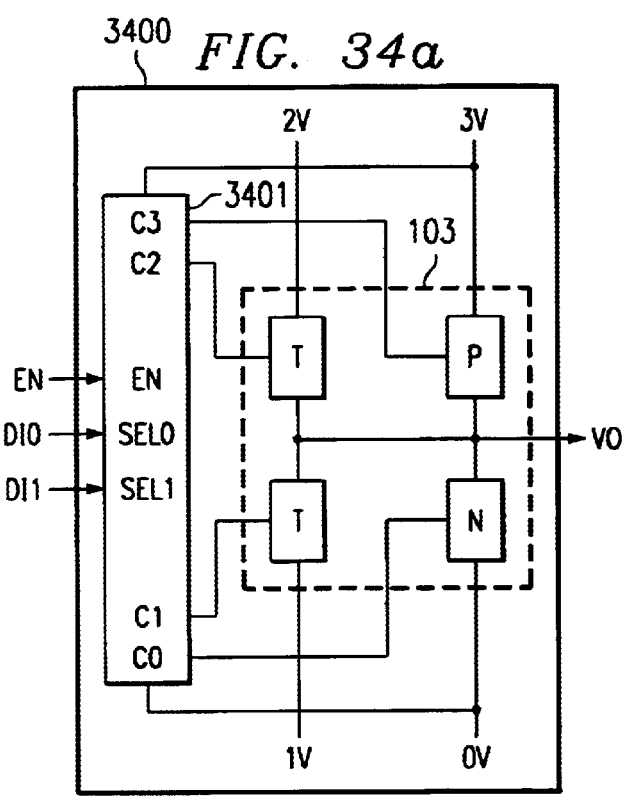
FIG. 34a
FIG. 34b
| EN | DI1:DI0 | C0 | C1 | C2 | C3 | VO |
|----|---------|----|----|----|----|----|
| 0  | X:X     | L  | L  | H  | H  | Z  |
| 1  | L:L     | H  | L  | H  | H  | 0  |
| 1  | L:H     | L  | H  | H  | H  | 1  |
| 1  | H:L     | L  | L  | L  | H  | 2  |
| 1  | H:H     | L  | L  | H  | L  | 3  |

QUAD STATE MEMORY DESIGN METHODS, CIRCUITS, AND SYSTEMS

This disclosure incorporates by reference the following Texas Instruments patent specifications: U.S. Pat. No. 09/527,967, filed Mar. 17, 2000, Signal Compression/Decompression Method and Apparatus; and U.S. Pat. No. 09/559,242, filed Apr. 26, 2000, Low Power Integrated Circuit Data Communication Interface System.

BACKGROUND OF THE INVENTION (1) Field of the Invention

This invention relates to electronic circuit design and particularly relates to the design methods of a quad state memory and the related circuits and systems.

(2) Description of the Related Art

Memories or flip flops used to design today's integrated circuits are based on storing one of two logic states, a first state for indicating a logic one and a second state for indicating a logic zero. Stored logic states are transferred between two-state memories either directly or via Boolean logic gates located between the memories. The transfer of two-state logic signals requires a wire for each unique signal transferred. Moore's Law predicts that the number of transistors per square inch on integrated circuits doubles each 18 months. Thus, potentially the number of two-state memories and signaling wires double each 18 months. As the density of integrated circuits tracks Moore's Law, the wiring within integrated circuit emerges as a serious obstacle to the advancement of semiconductors. Also, as the number of signaling wires increase, power consumption of integrated circuits, related to charging and discharging of wiring capacitance, also increases and emerges as another serious obstacle to the advancement of semiconductors. Lowering integrated circuit operation speed can reduce power consumption, but at the expense of performance. Lowering integrated circuit operating voltages can reduce power consumption, but the electrical properties of semiconductor material will eventually arrive at a point to where further reductions in operating voltages is not a possibility. Therefore, a need has arisen in the industry for a new approach in designing integrated circuits such that it is possible to maintain the ability to include more and more functionality within an integrated circuit.

BRIEF SUMMARY OF THE INVENTION

The present invention provides novel quad-state memory and other circuit elements that can be used as fundamental building blocks for designing high speed, high density, and low power integrated circuits. The quad state building block elements enable integrated circuits to operate using fewer wiring interconnects as compared with integrated circuits designed with conventional two state building block elements. Advantageously, even though fewer wiring interconnects are used, integrated circuits designed using the quad state building block elements of the invention maintain the signaling speed and information density of integrated circuits designed with conventional two state building block elements. The quad state building block elements include both elements for storing quad state signals and for performing logical operations on quad state signals. The present invention provides for interfacing between quad state and two state circuit domains to enable both technology domains to be used together on the same integrated circuit. The present invention provides for testing of quad state circuit elements used within an integrated circuit. Further, the present invention provides for inputs and outputs of integrated circuit to operate using the quad state signaling approach, which allows a reducing the number of input and output terminals required on an integrated circuit.

BRIEF DESCRIPTION OF THE SEVERAL VIEWS OF THE DRAWINGS

FIG. 1 illustrates an example implementation of a quad-state memory according to the invention.

FIG. 2 illustrates an example implementation of a voltage to state converter according to the invention.

FIG. 3 illustrates an example implementation of a quad-state memory including a set and reset capability according to the invention.

FIG. 7 illustrates an example implementation of a quad-state to two-state decompressor circuit according to the invention.

FIG. 16 illustrates an example of a conventional two-state parallel input serial output (PISO) circuit arrangement.

FIGS. 17A and 17B illustrate an example implementation of a quad-state PISO circuit arrangement according to the invention that could be functionally substituted for the conventional two-state PISO circuit arrangement of FIG. 16.

FIG. 25 illustrates an example implementation of a BIST testable quad-state circuit arrangement according to the invention that could be functionally substituted for the conventional two-state circuit arrangement of FIG. 24.

FIG. 26 illustrates an example implementation of a quad-state memory including a quad-state to two-state decompressor circuit of FIG. 7 according to the invention.

FIG. 27 illustrates an example implementation of the quad-state memory of FIG. 26 being used as registration between a two-state signal source and a two-state signal destination according to the invention.

FIG. 28 illustrates an example implementation of a quad-state memory including both a quad state signal output and two-state signals outputs from a quad-state to two-state decompressor circuit of FIG. 7 according to the invention.

FIG. 33 illustrates an example implementation of an integrated circuit having registered quad-state inputs and outputs coupled to two-state circuitry, according to the invention.

FIG. 34 illustrates an example implementation of a two-state to quad-state compressor circuit with an output enable/disable capability according to the invention.

INVENTION DESCRIPTION

Figure 4A:
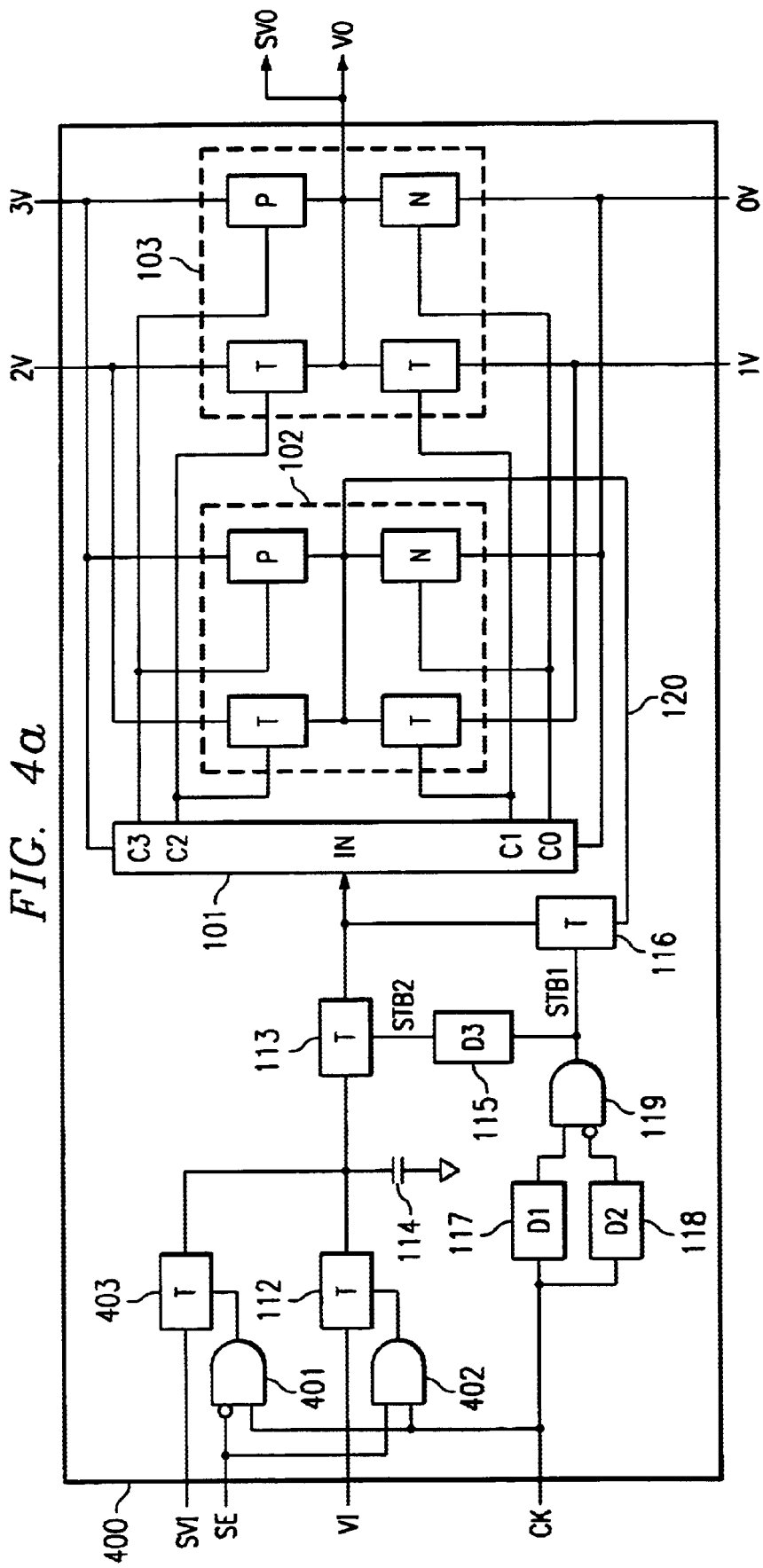
FIG. 4 illustrates an example implementation of a quad-state memory including scan test circuitry according to the invention.

FIG. 1 illustrates an example circuit implementation of the quad state memory (QSM) 100 of the present invention. QSM 100 includes a voltage input (VI), a voltage output (VO), and a clock (CK) input. QSM 100 is connected to voltage supplies of 0V, 1V, 2V, and 3V. Internally QSM 100 consists of a voltage to state converter 101, state feedback circuit 102, state output circuit 103, clock circuitry 117, 118, 119, 115, 116, VI transmission gates (T-gates) 112, 113, and 116, and VI holding capacitor 114. One lead of capacitor 114 is connected to the node between T-gates 112 and 113 and the other lead of capacitor 114 is connected to ground, which is equal to the 0V supply.

QSM 100 duplicates the memory functionality of the D flip flop pair 140. While various types of D flip flops could be illustrated in 140, i.e. two phase level sensitive flip flops and single phase edge triggered flip flops, edge triggered types are shown. The VI input of QSM 100 is encoded by four voltage levels to represent all possible Ai and Bi input combinations to the D flip flop pair 140. The VO output of QSM 100 is encoded by four voltage levels to represent all possible Ao and Bo output combinations from D flip flop pair 140. The voltage to state convention table 161, to be used by the present invention, indicates that; (1) 0 volts on VI/VO encodes to Bi/o=Low and Ai/o=Low, (2) 1 volt on VI/VO encodes to Bi/o=Low and Ai/o=High, (3) 2 volts on VI/VO encodes to Bi/o=High and Ai/o=Low, and (4) 3 volts on VI/VO encode to Bi/o=High and Ai/o=High. It should be clear that other voltage to state conventions could be used as well. From inspection, it is clear that QSM 100 requires one encoded data input (VI) as opposed to two conventional data inputs (Ai and Bi) for D flip flop pair 140, and QSM 100 requires one encoded data output (VO) as opposed to two conventional data outputs (Ao and Bo) for D flip flop 140.

Voltage to state converter 101 serves to input a voltage from T-gate 113 or 116 and output a state representation of the input voltage to state feedback circuit 102 and state output circuit 103, via the C0–3 outputs. Voltage to state converter 101 enables only one of the C0–3 outputs to be active at any one time. C0 is connected to the gate inputs of N-channel transistors 107 and 111 of 102 and 103, respectively. C1 is connected to the gate inputs of T-gates 105 and 109 of 102 and 103, respectively. C2 is connected to the gate inputs of T-gates 104 and 108 of 102 and 103, respectively. C3 is connected to the gate inputs of P-channel transistors 106 and 110 of 102 and 103, respectively.

State feedback circuit 102; (1) outputs 0V to T-gate 116 on feedback path 120 when C0 is active, (2) outputs 1V to T-gate 116 on feedback path 120 when C1 is active, (3) outputs 2V to T-gate 116 on feedback path 120 when C2 is active, and (4) outputs 3V to T-gate 116 on feedback path 120 when C3 is active. State output circuit 103; (1) outputs 0V on VO when C0 is active, (2) outputs 1V on VO when C1 is active, (3) outputs 2V on VO when C2 is active, and (4) outputs 3V on VO when C3 is active. Both state feedback circuit 102 and state output circuit 103 respond identically to the C0–3 outputs from voltage to state converter circuit 101. State feedback circuit 102 is provided as a separate circuit from state output circuit 103 to provide a feedback signal which is isolated from noise that might be present on the VO output of the state output circuit 103. The transistors 108–111 of the state output circuit 103 are designed to provide adequate VO drive capability, whereas the transistors of state feedback circuit 102 are designed to provide only the drive needed to maintain the feedback voltage state being output from voltage to state converter 101.

In both the state feedback circuit 102 and state output circuit 103, (1) P-channel transistors 106 and 110 are used to provide switching of the 3V supply to feedback path 120 and VO respectively, (2) N-channel transistors 107 and 111 are used to provide the switching of the 0V supply to the feedback path 120 and VO respectively, (3) P and N channel transmission gates 104 and 108 are used to provide the switching of the 2V supply to the feedback path 120 and VO respectively, and (4) P and N channel T-gates 105 and 109 are used to provide the switching of the 1V supply to the feedback path 120 and VO respectively. T-gates 104, 105, 108, 109 are preferred as switches over single P and N channel transistors since they provide better bi-directional, low on resistance switching properties for VO and feedback path 120 signals that switch between 2V and one of either 0V, 1V, or 3V for 104 and 108, and between 1V and one of either 0V, 2V, or 3V for 105 and 109. Example T-gate 170 shows that it includes both a P and N channel transistor path between its "a" and "b" terminals. When an off condition is input to the T-gate both transistors are gated off. When an on condition is input to the T-gate, both transistors are gated on, providing the above mentioned bi-directional, low on resistance switching property QSM truth table 160 indicates the operation of the QSM. When no clock pulse (P) is present, the voltage on VI is a don't care and the voltage on VO remains in its present state. The encoded B:A representation of a VO remaining in its present state is indicated by "-:-". When a clock pulse occurs, the voltage on VI is transmitted to VO, via the voltage to state converter 101, where it is maintained following the clock pulse by the feedback path 120.

The timing diagram 180 provides the detail clocking scheme of the QSM. When the clock is low, T-gates 112 and 116 are on and T-gate 113 is off. While clock is low, capacitor 114 charges or discharges to the voltage level of VI via T-gate 112. While clock is low, T-gate 116 is on to allow the voltage output from feedback circuit 102 to provide input to the voltage to state converter 101. This feedback connection 120 between feedback circuit 102 and voltage to state converter circuit 101 forms the memory latching mechanism of the QSM. When the clock transitions high, T-gates 112 and 116 turn off and T-gate 113 turns on. With T-gate 113 on, the voltage on capacitor 114 is allowed to drive the input of the voltage to state converter. In response to the voltage input from T-gate 113, the voltage to state converter 101 adjusts its C0–3 outputs to cause the feedback path 120 of state feedback circuit 102 and the VO of state output circuit 103 to output a voltage equivalent to the voltage being input to the voltage to state converter 101. When the clock transitions low, T-gates 112 and 116 turn on and T-gate 113 turns off. With T-gate 116 on, the new voltage output from state feedback circuit 102 is the sole input to the voltage to state converter and serves to maintain the present C0–3 state outputs of the voltage to state converter 101. The state output circuit 103 is thus controlled by the latched C0–3 outputs to maintain the new VO output from the QSM. The above described action takes place during each new clock pulse input to allow the QSM to input and store a new quad-state output voltage at VO.

During the low to high clock transition, delay 1 (D1) and delay 2 (D2) circuits 117 and 118 are used at the input of AND gate 119 to produce a temporary strobe (STB1) output from the And gate to T-gate 116, as seen in the timing diagram 180. Delay 3 (D3) circuit 115 is used to produce another temporary strobe (STB2) between the And gate and T-gate 113. These delay circuits insure a proper turn on and turn off sequence of the T-gates during each clock pulse. The sequence starts when the clock initially goes high, which turns T-gate 112 off. After the D1 circuit delay, STB1 goes high to turn off T-gate 116 and open the feedback path 120. After the D3 circuit delay, STB2 goes high to turn on T-gate 113 to input the VI voltage stored in capacitor 114. In response to the VI voltage, the state converter 101 outputs new C0–3 states to the state feedback circuit 102 and state output circuit 103 to cause feedback path 120 and VO to go to a voltage level equivalent to the VI voltage level. After the D2 circuit delay, STB1 returns low to turn on T-gate 116 to form the feedback path again with the new voltage output from the state feedback circuit 102, which has been set equivalent to VI in capacitor 114 via the C0–3 outputs. After a delay from the D3 circuit, STB2 returns low to turn off T-gate 113, leaving the voltage on the state feedback path 120 as the sole voltage input to the voltage to state converter 101.

Since T-gate 112 is turned off on the rising edge of the clock, the QSM 100 operates as an rising edge sensitive memory with near zero hold time on the VI input with respect to the rising clock edge. Since T-gate 116 is turned off before T-gate 113 is turned on, T-gate 116 does not act as a charge or discharge path for the VI voltage level stored in capacitor 114 when T-gate 113 turns on. During the D1 time delay, where both T-gates 113 and 116 are off, the small intrinsic capacitance at the input node of the voltage to state converter 101 maintains a stable voltage input until T-gate 113 turns on following the D1 time delay. Capacitor 114 will have sufficient capacity to drive the small intrinsic capacitance of the input node of the voltage to state converter 101 to the VI voltage level stored in capacitor 114.

While this QSM circuit example uses a single clock and internally circuitry to adapt the single clock into separate strobes operable to perform the memory storage operation, a QSM with multiple clocks could also have been used to provide the separate control for performing the memory storage operation, as well.

FIG. 2 illustrates an example circuit implementation of the voltage to state converter 101. Voltage to state converter 101 consists of a threshold detection circuit 210 and a C0–3 output decoder 211. The threshold detection circuit 210 serves to input the voltage from T-gate 113 or T-gate 116 and output a three voltage signal representations (VS1–3) of the input voltage. The C0–3 output decoder serves to input the VS1–3 signals, decode the VS1–3 signals into C0–3 outputs. The C0–3 outputs are used to activate a selected one of the transistors in the state feedback circuit 102 and state output circuit 103, as previously described.

Threshold detection circuit 210 consists of; (1) a first path comprising a P-channel transistor 201 with one channel terminal connected to 3V and the other channel terminal connected to 0V through a current source 205, (2) a second path comprising a P-channel transistor 202 with one channel terminal connected to 3V and the other channel terminal connected to 0V through a current source 206, and (3) a third path comprising an N-channel transistor 203 with one channel terminal connected to 0V and the other channel terminal connected to 3V through a current source 204. Current sources 204–206 can be implemented using resistors or transistors. The gate input of each of the transistors are commonly connected to an input (IN) from T-gates 113 and 116. Capacitor 209 indicates the previously mentioned intrinsic capacitance, which consists of the transistor 201–203 gate and wiring capacitance. The VS1 output signal is connected between current source 204 and transistor 203. The VS2 output signal is connected between transistor 202 and current source 206. The VS3 output signal is connected between transistor 201 and current source 205. Transistor 203 is designed to turn on when its gate voltage threshold (Vt1) is above 0.5 volts, otherwise its off. Transistor 202 is designed to turn off when its gate voltage threshold (Vt2) is above 1.5 volts, otherwise its on. Transistor 201 is designed to turn off when its gate voltage threshold (Vt3) is above 2.5 volts, otherwise its on.

When 0V is input (IN) to the threshold detection circuit 210, transistor 203 is off and VS1 is high, transistor 202 is on and VS2 is high, and transistor 201 is on and VS3 is high.

When 1V is input to the threshold detection circuit 210, transistor 203 is on and VS1 is low, transistor 202 is on and VS2 is high, and transistor 201 is on and VS3 is high. When 2V is input to the threshold detection circuit 210, transistor 203 is on and VS1 is low, transistor 202 is off and VS2 is low, and transistor 201 is on and VS3 is high. When 3V is input to the threshold detection circuit 210, transistor 203 is on and VS1 is low, transistor 202 is off and VS2 is low, and transistor 201 is off and VS3 is low.

C0–3 output decoder 211 inputs the VS1–3 signals and decodes them, using the NAND gate 207 and AND gate 208 arrangement shown, into appropriate logic states on C0–3 to control the transistors of the feedback state circuit 102 and output state circuit 103. Truth table 220 indicates this decoding as follows. When 0V is input on IN, the VS1–3 signals are established and input to decoder 211 to set C0=High, C1=Low, C2=High, and C3=High. When 1V is input on IN, the VS1–3 signals are established and input to decoder 211 to set C0=Low, C1=High, C2=High, and C3=High. When 2V is input on IN, the VS1–3 signals are established and input to decoder 211 to set C0=Low, C1=Low, C2=Low, and C3=High. When 3V is input on IN, the VS1–3 signals are established and input to decoder 211 to set C0=Low, C1=Low, C2=High, and C3=Low. While this decoding is used, other decodings are possible, depending on the type of C0–3 control required to regulate the type and arrangement of the transistors in the state feedback circuit 102 and state output circuit 103, or other circuits coupled to the C0–3 control outputs.

From truth table 220 it is seen that the C0–3 output settings control the transistors of the state feedback circuit 102 and state output circuit 103 such that the feedback path 120 and VO are driven to; (1) an encoded B:A=L:L or 0V when IN=0V, (2) an encoded B:A=L:H or 1V when IN=1V, (3) an encoded B:A=H:L or 2V when IN=2V, and (4) an encoded B:A=H:H or 3V when IN=3V. Again, this encoding matches the voltage to state convention of table 161.

QSM with Set & Reset Inputs

In FIG. 3, QSM 300 duplicates the memory functionality of the D flip flop pair 340, which incorporate set and reset inputs. QSM 300 is the same as QSM 100 except that it has a set input to initialize the quad-state memory to the encoded B:A=H:H or 3V state, and a reset input to initialize the quad-state memory to the encoded B:A=L:L or 0V state. To achieve the set and reset capability, AND gate 301 is inserted between gate 119 and T-gate 113, and OR gate 302 is inserted between gate 119 and T-gate 116. The set input is connected to the gate input of an added T-gate 303 and to the inputs of gates 301 and 302. The reset input is connected to the gate input of an added T-gate 304 and to the inputs of gates 301 and 302. One terminal of T-gate 303 is connected to 3V and the other terminal is connected to the input of voltage to state converter 101, to which T-gates 113 and 116 also connect. One terminal of T-gate 304 is connected to 0V and the other terminal is connected to the input of voltage to state converter 101.

Truth table 360 depicts the set and reset operation of QSM 300. This description assumes set and reset operations occur during times when the clock input is low. The reset (RST) operation occurs when the reset input is controlled to a logic zero, which force T-gates 113 and 116 to be off, via gates 301 and 302, and T-gate 304 to be on. In this condition, the input of voltage to state converter 101 is driven by 0V from T-gate 304, which causes the feedback path 120 and VO to be driven to the encoded B:A=L:L or 0V state. When the reset input returns to a logic one level, the forced off state of T-gates 113 and 116 is removed and T-gate 304 turns off. Since the clock is low during the reset operation, the 0V state input to voltage to state converter 101 is maintained by the feedback path 120 through T-gate 116. The set (SET) operation occurs when the set input is controlled to a logic zero, which force T-gates 113 and 116 to be off, via gates 301 and 302, and T-gate 303 to be on. In this condition, the input of voltage to state converter 101 is driven by 3V from T-gate 303, which causes the feedback path 120 and VO to be driven to the encoded B:A=H:H or 3V state. When the set input returns to a logic one level, the forced off state of T-gates 113 and 116 is removed and T-gate 303 turns off. Since the clock is low during the set operation, the 3V state input to voltage to state converter 101 is maintained by the feedback path 120 through T-gate 116.

Following a set or reset operation when both set and reset are high, the QSM 300 operates, as shown in truth table 360, identical to the QSM 100. Gates 301 and 302 are designed to provide the delays required for storing VI input to the QSM 300 in response to the clock, as previously described. QSM 300 simply illustrates the ability of the quad-state memory to be initialized to its encoded B:A=H:H or 3V "set" state, or to its encoded B:A=L:L "reset" state in response the set and reset inputs.

QSM with Scan Test Circuitry

In FIG. 4, QSM 400 duplicates the memory functionality of the D flip flop pair 440, which incorporate scan test circuitry comprising a multiplexer at the D input of each D flip flop. QSM 400 is the same as QSM 100 except that it has a scan enable (SE) input to place the QSM in normal or scan mode, a scan voltage input (SVI) for inputting encoded scan data, and a scan voltage output (SVO) for outputting encoded scan data. To achieve the scan test capability, OR gate 402 is inserted between the clock input and T-gate 112, and OR gate 401 and T-gate 403 are added and connected as shown. The SE input is connected to an inverted input of 401 and to an input of gate 402. When SE is low, the clock is allowed to pass through gate 402 to T-gate 112, but the clock input to gate 401 is gated off and the output of gate 401 is set to turn T-gate 403 off, blocking the SVI input. When SE is high, the clock is allowed to pass through gate 401 to T-gate 403, but the clock input to gate 402 is gated off and the output of gate 402 is set to turn T-gate 112 off, blocking the VI input. Thus gates 401 and 402 in combination with the SE input operate as a multiplexer to allow either the VI input to be clocked into QSM 400 when SE is low via T-gate 112, or to allow SVI to be clocked into QSM 400 when SE is high via T-gate 403. This multiplexing action is indicated in timing diagram 480, where when SE is low and a clock pulse occurs, VI input is stored in QSM 400 and output on VO, and when SE is high and a clock pulse occurs, SVI input is stored in QSM 400 and output on SVO. During scan testing, the time when SE is low is the time encoded system data is captured into the QSM 400, and the time when SE is high is the time the captured encoded system data is shifted or scanned through QSM 400. Table 461 indicates that the encoded data on SVI, VI, SVO, and VO maintains the voltage to state convention of table 161.

Truth table 460 depicts the normal and scan operation modes of QSM 400. If the clock input is low, the state of SE, SVI, and VI is a don't care, and the VO/SVO output remains in its present encoded B:A state. When SE is low and a clock pulse occurs, the encoded state on VI is clocked into QSM 400 and output as encoded B:A data on VO/SVO. When SE is high and a clock pulse occurs, the encoded state on SVI is clocked into QSM 400 and output as encoded B:A data on VO/SVO. As can be seen from truth table 460, the normal operation (SE=0) is the same as QSM 100. Also, the scan operation (SE=1) is the same as the QSM 100 with the exception that encoded SVI data is stored in QSM instead of encoded VI data.

It is important to note that in the conventional scan testable D-flip flop pair 440, two shift clocks are required to shift the data captured from the two flip flips, while only a single shift clock is required to shift the equivalent encoded B:A data from the QSM 400. So using QSM 400 instead of convention scan D flip flop pairs 440 reduces scan test time by one half (i.e. reduces number of shift or scan clocks by one half). For example, an integrated circuit containing a scan path with 10,000 conventional scan D flip flops in series will require 10,000 clocks to shift data into and from the scan path during each test pattern application. However, if QSM 400 were used in the integrated circuit instead of conventional D flip flops, a scan path of 5,000 QSMs 400 in series would require only 5,000 clocks to shift encoded data into and from the scan path during each test pattern. Thus it is clear that scan test time is reduced using QSMs 400 instead of conventional D flip flops.

QSM with 3-State Outputs

Figure 5A:
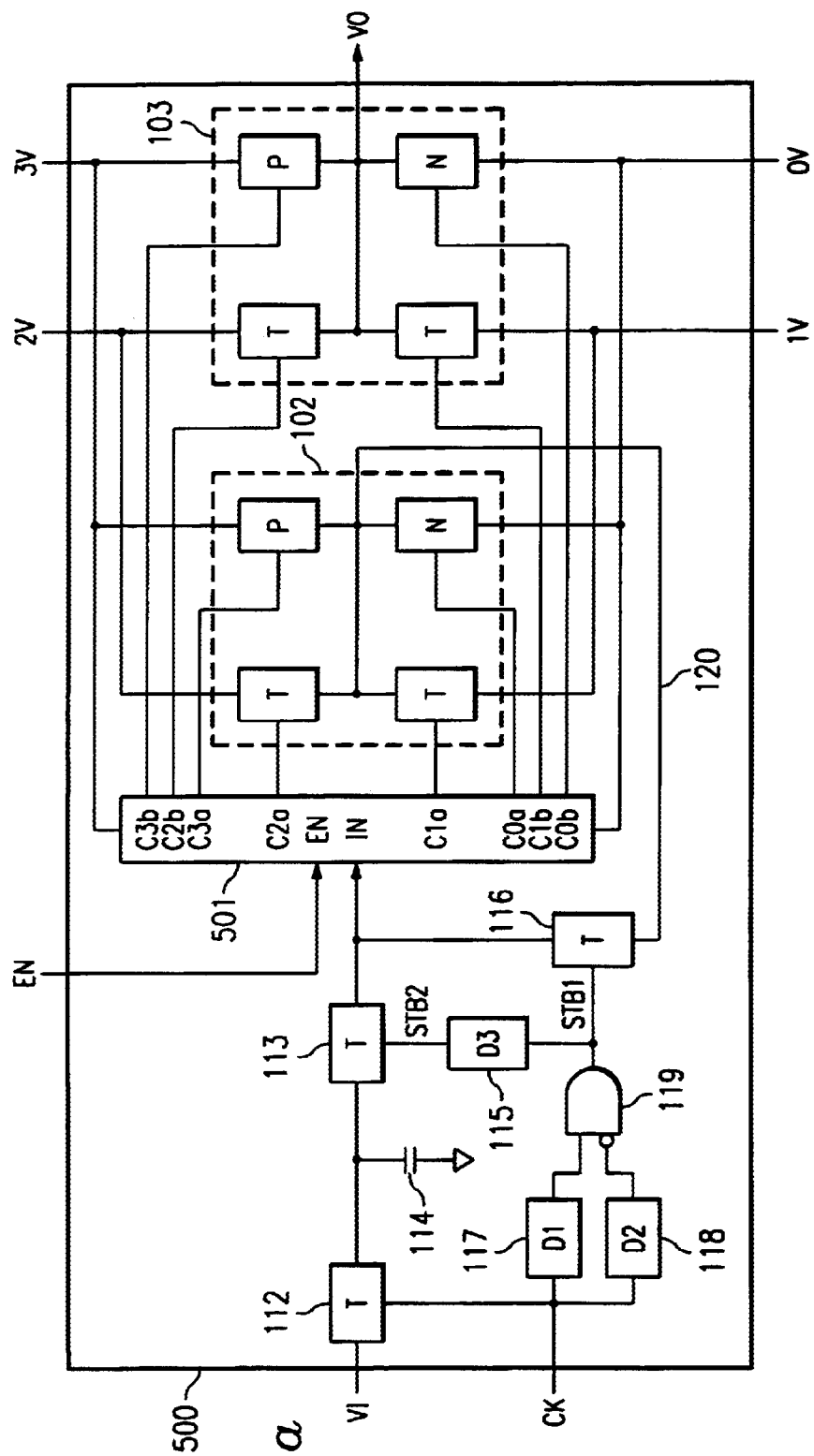
FIG. 5 illustrates an example implementation of a quad-state memory including an output enable/disable capability according to the invention.

In FIG. 5, QSM 500 duplicates the functionality of the D flip flop pair 440, which incorporates 3-state output circuitry. QSM 500 is the same as QSM 100 except that it has an enable (EN) input connected to a new voltage to state converter 501. Voltage to state converter 501 has separate control outputs, C0a–C3a and C0b–C3b, for the state feedback circuit 102 and state output circuit 103. Control outputs C0a–C3a are input to state feedback circuit 102, and control outputs C0b–C3b are input to state output circuit 103.

The operation of QSM 500 is depicted in truth table 560. When EN is high, QSM 500 operates the same as QSM 100 to store VI data to the VO output during each clock pulse input. However, when EN is low, the C0b–C3b outputs are forced to states that cause all transistors in the state output circuit 103 to be turned off, effectively causing the VO output to be placed in a non-driven state. Since the term 3-state is typically used when a conventional two state output is placed in a non-driven state (i.e. a third state), the term 5-state is introduced and used to indicate when the quad-state output VO is placed in a non-driven state (i.e. the fifth state). In table 560 and when EN is low, VI input continues to be clocked and stored in the QSM 500 as an internal VO (VOi) quad-state memory state as previously described in regard to QSM 100. However, since the QSM 500 VO is disabled to the 5-state condition, the internal VOi state stored is not driven onto the VO output. The 5-state feature of QSM 500 enables bussing of multiple QSM 500 VO outputs onto a common quad-state signal wiring path.

Figures 6B, 8A, 8B:
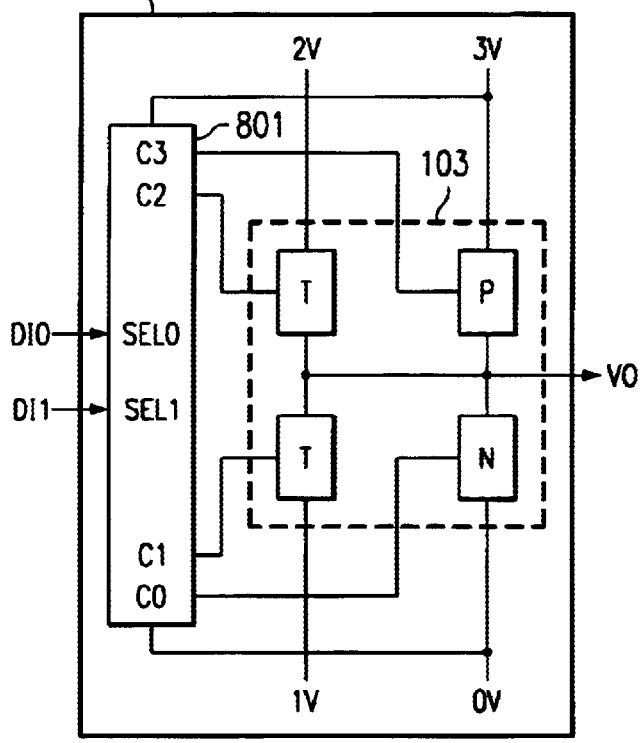
FIG. 6 illustrates an example implementation of a voltage to state converter with output enable/disable capability according to the invention.
FIG. 8 illustrates an example implementation of a two-state to quad-state compressor circuit according to the invention

FIG. 6 illustrates an example implementation of voltage to state converter 501, which comprises a threshold detection circuit 210 and an output decoder 611. Threshold detection circuit 210 operates as previously described in regard to FIG. 2. Output decoder 611 comprises the NAND gate 207 and AND gate 208 decode circuit arrangement and VS1–3 connections of FIG. 2, which, in QSM 500, is used to control the on and off states of the transistors in the state feedback circuit 102. Output decoder 611 comprises additional decode circuitry for controlling the on and off states of the transistors in the state output circuit 103. This additional decode circuitry includes OR gate 601, NAND gate 602, and AND gates 603 and 604. The VS1–3 outputs from voltage threshold circuit 210 are connected as input to the gates of the additional decode circuit as shown in FIG. 6. The EN input is also input to the gates of the additional circuitry as shown in FIG. 6.

Truth table 620 illustrates the behavior of voltage to state converter 501. When the EN input is high and in response to quad-state voltage inputs (i.e. 0V, 1V, 2V, 3V) on the IN input, the C0a–C3a and C0b–C3b outputs operate together and identically to the previously described C0–3 outputs of FIG. 2. Thus, while the EN is high, the state feedback circuit 102 and state output circuit 103 of FIG. 5 are made to operate identical to the state feedback circuit 102 and state output circuit 103 of FIG. 1. When the EN input is low, the C0a–C3a outputs continue to operate identically to the C0–C3 output of FIG. 2, while the C0b–C3b outputs are forced into a static state which turns off all the transistors of the state output circuit 103 and places the VO output into the 5-state output condition.

Quad-State to Two-State Decompressor Gate

To allow a quad-state circuit, such as QSM 100, to output a quad-state value to a two-state circuit, a circuit for decompressing quad-state values into their equivalent two-state B:A encoded values is required. In FIG. 7, an example circuit of a quad-state to two-state decompressor (D) gate 700 is depicted. D-gate 700 comprises a voltage threshold detecting circuit 210, complementary transistors 701 and 702 forming a two-state output DO1 driver, complementary transistors 703 and 704 forming a two-state output DO0 701 driver, and an interface between the VS1–3 outputs of 210 and gate inputs of the DO1 and DO0 two-state output drivers. VS1 connects to a first terminal of T-gate 706 and VS3 connects to a first terminal of T-gate 705. The second terminals of T-gate 705 and 706 are connected together and to the gate inputs transistors 703 and 704 of the DO0 output driver. VS2 connects to the gate inputs of T-gates 705 and 706 and to the gate inputs of transistors 701 and 702 of the DO1 output driver.

Truth table 720 indicates the operation of the D-gate. When VI is 0V, VS1:VS2:VS3=H:H:H. In this condition, VS2 turns on T-gate 706 and turns off T-gate 705. VS1 is input to the gate inputs of the DO0 output driver, via T-gate 706, to cause DO0 to be Low and VS2 is input to the gates of the DO0 driver to cause DO1 to be Low. When VI is 1V, VS1:VS2:VS3=L:H:H. In this condition, VS2 turns on T-gate 706 and turns off T-gate 705. VS1 is input to the gate inputs of the DO0 output driver, via T-gate 706, to cause DO0 to be High and VS2 is input to the gates of the DO1 driver to cause DO1 to be Low. When VI is 2V, VS1:VS2:VS3=L:L:H. In this condition, VS2 turns off T-gate 706 and turns on T-gate 705. VS3 is input to the gate inputs of the DO0 output driver, via T-gate 705, to cause DO0 to be Low and VS2 is input to the gates of the DO1 driver to cause DO1 to be High. When VI is 3V, VS1:VS2:VS3=L:L:L. In this condition, VS2 turns off T-gate 706 and turns on T-gate 705. VS3 is input to the gate inputs of the DO0 output driver, via T-gate 705, to cause DO0 to be High and VS2 is input to the gates of the DO1 driver to cause DO1 to be High.

From the above description it is seen that; (1) the D-gate operates to decompress a quad-state B:A encoded 0V value into its DO1:DO0=L:L two-state pair equivalency for input into a two-state circuit, (2) the D-gate operates to decompress a quad-state B:A encoded 1V value into its DO1:DO0=L:H two-state pair equivalency for input into a two-state circuit, (3) the D-gate operates to decompress a quad-state B:A encoded 2V value into its DO1:DO0=H:L two-state pair equivalency for input into a two-state circuit, and (4) the D-gate operates to decompress a quad-state B:A encoded 3V value into its DO1:DO0=H:H two-state pair equivalency for input into a two-state circuit.

Two-State to Quad-State Compressor Gate

To allow a quad-state circuit, such as QSM 100, to input a quad-state value from a two-state circuit, a circuit for compressing a two-state value pair into an equivalent quad-state value is required. In FIG. 8, an example circuit of a two-state to quad-state compressor (C) gate 800 is depicted. C-gate 800 comprises a selector circuit 801 and the state output circuit 103 of FIG. 1. Selector circuit 801 is a simple decoder circuit that inputs data input 0 (DI0) and data input 1 (DI1) signal pairs from a two-state circuit and outputs appropriately decoded C0–3 control signals to the transistors of the state output circuit 103.

Truth table 820 indicates the operation of the C-gate. When DO1:DO0=L:L, the C0–3 control signals are set to cause VO of the state output circuit 103 to be equal to 0V. When DO1:DO0=L:H, the C0–3 control signals are set to cause VO of the state output circuit 103 to be equal to 1V. When DO1:DO0=H:L, the C0–3 control signals are set to cause VO of the state output circuit 103 to be equal to 2V. When DO1:DO0=H:H, the C0–3 control signals are set to cause VO of the state output circuit 103 to be equal to 3V.

From the above description it is seen that; (1) the C-gate operates to compress a two-state DI1:DI0=L:L input pair into an equivalent B:A encoded quad-state 0V value for input to a quad-state circuit, (2) the C-gate operates to compress a two-state DI1:DI0=L:H input pair into an equivalent B:A encoded quad-state 1V value for input to a quad-state circuit, (3) the C-gate operates to compress a two-state DI1:DI0=H:L input pair into an equivalent B:A encoded quad-state 2V value for input to a quad-state circuit, and (4) the C-gate operates to compress a two-state DI1:DI0=H:H input pair into an equivalent B:A encoded quad-state 3V value for input to a quad-state circuit.

Quad-State & Two-State Logic Domains

Figure 9:
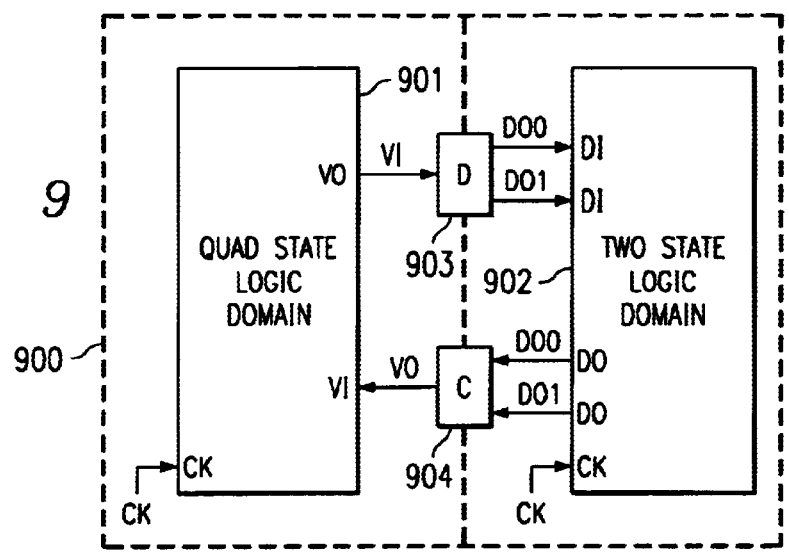
FIG. 9 illustrates an example of the decompressor circuit of FIG. 7 and the compressor circuit of FIG. 8 being serving as interfaces between a quad-state circuit domain and a two-state circuit domain according to the invention.

FIG. 9 illustrates an example circuit application 900 where D-gates 903 and C-gates 904 serve as the communication interface between a quad-state logic domain 901 and a two-state logic domain 902. Quad-state domain 901 outputs B:A encoded VO signals to D-gates 903 which translates each VO signal into DO0 and DO1 signal pairs that are input to the two-state domain 902. Likewise, two-state domain 902 outputs DO0 and DO1 signal pairs to C-gates 904 which translate each pair into a B:A encoded VI signal that is input to the quad-state domain 901. While only one D-gate and C-gate are shown, any number could be interfaced between the quad-state and two state domains. Also, while the D-gate and C-gate are shown separate from the quad-state and two state domains, they could be included as an integral part of either domain. For the purpose of reducing the number of bussed wires between quad-state and two-state domains, it is advantageous to include the D-gate and C-gate circuits as part of the two-state domain, since this will allow the bussing of B:A encoded VO and VI signals to occur between the domains using one half the wires that would be required to bus conventional two-state signals between the domains. The quad-state domain 901, two-state domain 902, D-gate 903, and C-gate 904 could be realized in any desired fashion including; (1) realization as sub-circuits within an integrated circuit, (2) realization as separate circuits assembled onto a circuit board or multi-chip module substrate, or (3) realization as separate circuit boards or multi-chip modules existing within an electrical system. Further, the quad-state and two-state logic domains could represent any type of circuit including; digital signal processors, micro-processors, micro-controllers, state machines, instruction register data paths, multiply & accumulate data paths, and memories such as RAMs, ROMs, FIFOs, Caches, and Register Files. D-gate and C-gate circuits could be used to reduce the number of wires on bussing paths existing in Von-Neumann and Harvard style architectures. The clock inputs to the 901 and 902 domains could be a common clock or clocks or separate clock or clocks.

Conventional Two-State & Equivalent Quad-State Circuit Examples

The following examples are provided to illustrate the ability of quad-state memories to be used in place of conventional two-state memories in some of the more common types of memory circuit design applications.

Pipeline Circuit Example

Figure 10:
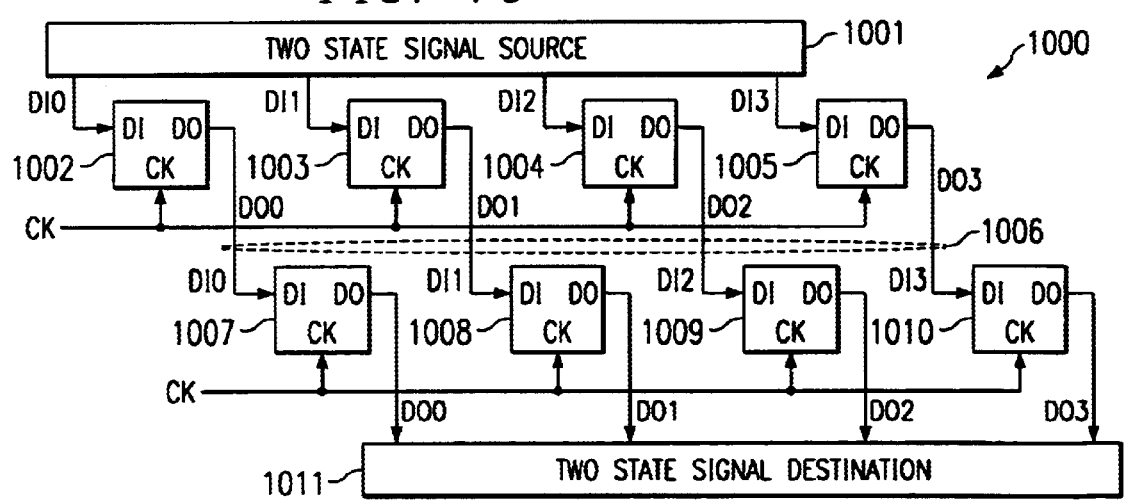
FIG. 10 illustrates an example of a conventional two-state pipeline circuit arrangement.

FIG. 10 illustrates a conventional two-state pipeline circuit 1000 example whereby DI0–3 two-state signals originating from a two-state signal source 1001 are clocked and stored into D flip flops 1002–1005. D-flip flops 1002–1005 output the stored DI0–3 signals over a bus 1006 to D-flip flops 1007–1010 where they are clocked and stored to be output to a two state signal destination 1011. Two-state signal source 1001 could be any type of circuit that outputs two-state signals, or it could be integrated circuit pads which are used to input two-state signals to the integrated circuit. Two-state signal destination 1011 could be any type of circuit that inputs two-state signals, or it could be integrated circuit pads which are used to output two-state signals from the integrated circuit.

Figure 11:
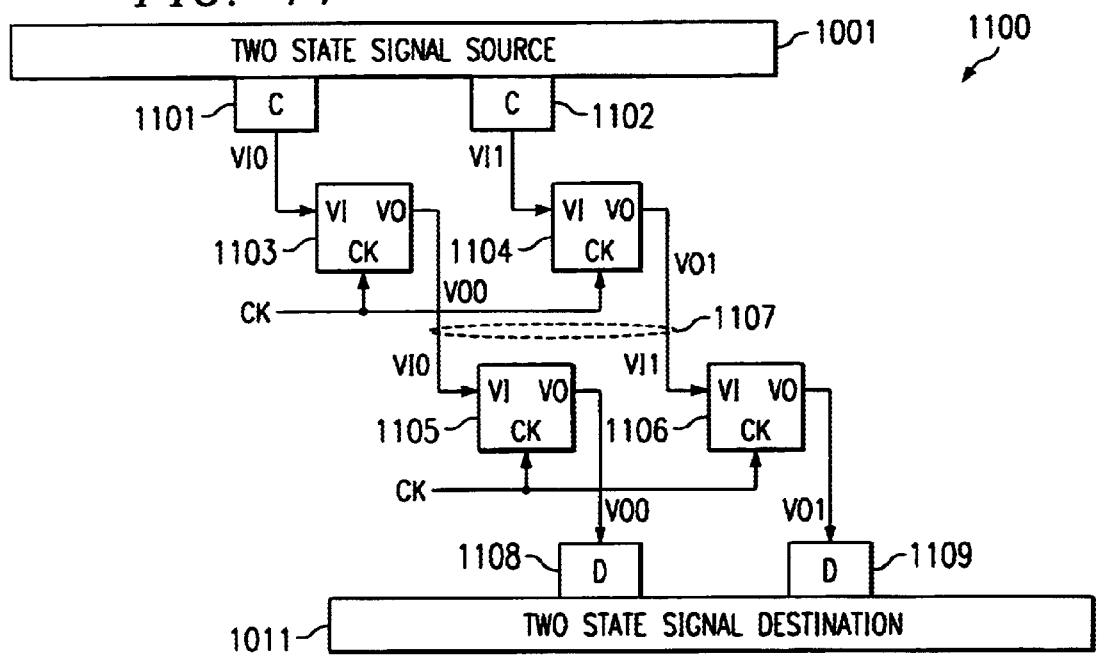
FIG. 11 illustrates an example implementation of a quad-state pipeline circuit arrangement according to the invention that could be functionally substituted for the conventional two-state pipeline circuit arrangement of FIG. 10.

FIG. 11 illustrates an equivalent quad-state pipeline circuit 1100 of the two-state pipeline circuit 1000. C-gate 1101 compresses the DI0 and DI1 outputs of the two state signal source 1001 into a quad-state VI0 signal and inputs the signal to QSM 1103. C-gate 1102 compresses the DI2 and DI3 outputs of the two state signal source 1001 into a quad-state VI1 signal and inputs the signal to QSM 1104. The output of QSM 1103 and 1104 are connected via bus 1107 to the inputs of QSM 1105 and 1106, respectively. The outputs of QSM 1105 and 1106 are input to D-gates 1108 and 1109, respectively. D-gate 1108 decompresses the quad-state VO0 signal output from QSM 1105 into the DO0 and DO1 signal pair for input to the two state signal destination 1011. D-gate 1109 decompresses the quad-state VO1 signal output from QSM 1106 into the DO2 and DO3 signal pair for input to the two state signal destination 1011. When clocked, the quad-state circuit 1100 duplicates the operation of the conventional circuit 1000.

One advantage of circuit 1100 over circuit 1000 is that bus 1107 requires only one half the wiring as bus 1006. Another advantage is that quad-state signal voltage swings are typically less that two-state voltage swings. The combination of these two advantages mean that less dynamic power, i.e. switching power, is consumed when operating circuit 1100 instead of operating circuit 1000. This can be understood from the fact that the quad-state circuit 1100 has a lesser amount of bus wiring capacitance (quad-state required ½ the two-state bus wires) to drive than the two-state circuit 1000 and the driven quad-state circuit 1100 voltage swings are typically less than the driven two-state circuit 1000 voltage swings. This power reduction advantage can be seen in all following two-state and quad-state circuit examples.

Also, while the FIG. 10 and 11 examples use a four signal wide two-state bus and an equivalent two signal wide quad-state bus arrangement, respectively, an equivalent quad-state bus of any even integer two-state bus is possible. For example, a 128 signal wide two-state bus could be equivalently formed using a 64 signal wide quad-state bus. This signal width reduction advantage can be seen in all following two-state and quad-state circuit examples.

Registration Circuit Example

Figure 12:
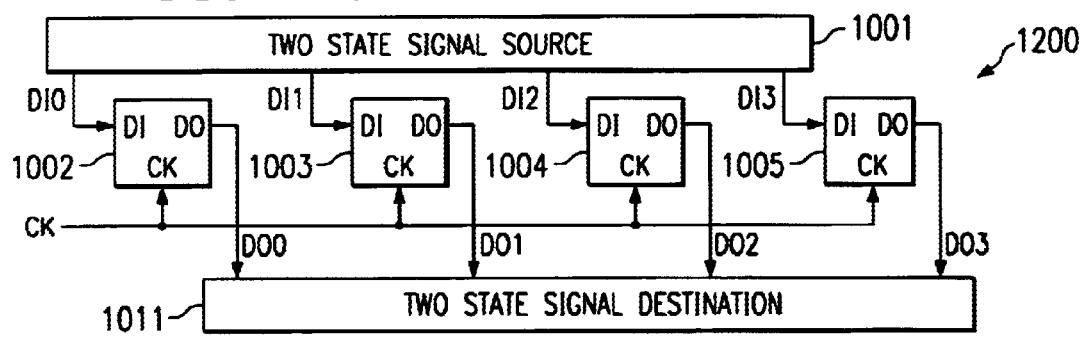
FIG. 12 illustrates an example of a conventional two-state registration circuit arrangement.

FIG. 12 illustrates a conventional two-state registration circuit 1200 example whereby DI0–3 two-state signals originating from a two-state signal source 1001 are clocked and stored into D flip flops 1002–1005 serving as a register. D-flip flops 1002–1005 output the stored DI0–3 signals to a two-state signal destination 1011 via the DO0–3 signals.

Figure 13:
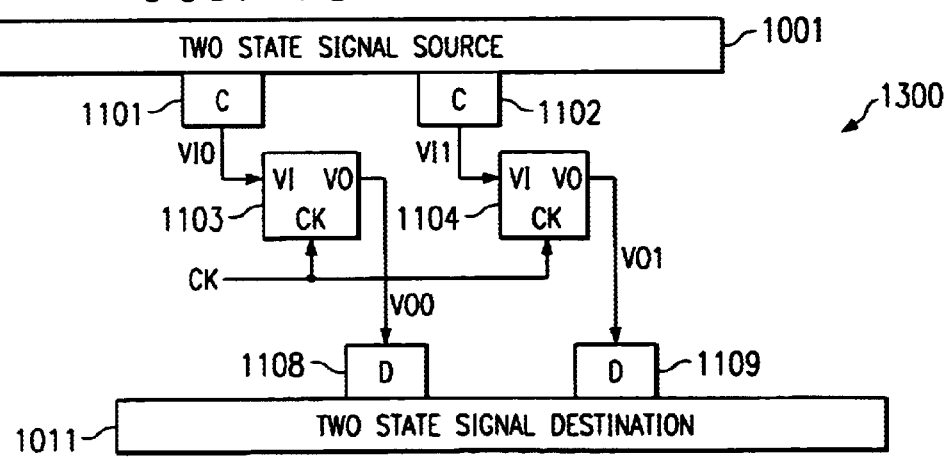
FIG. 13 illustrates an example implementation of a quad-state registration circuit arrangement according to the invention that could be functionally substituted for the conventional two-state registration circuit arrangement of FIG. 12.

FIG. 13 illustrates an equivalent quad-state registration circuit 1300 of the two-state registration circuit 1200. C-gate 1101 compresses the DI0 and DI1 outputs of the two state signal source 1001 into a quad-state VI0 signal and inputs the signal to QSM 1103. C-gate 1102 compresses the DI2 and DI3 outputs of the two-state signal source 1001 into a quad-state VI1 signal and inputs the signal to QSM 1104. The outputs of QSM 1103 and 1104 are input to D-gates 1108 and 1109, respectively. D-gate 1108 decompresses the quad-state VO0 signal output from QSM 1103 into the DO0 and DO1 signal pair for input to the two state signal destination 1011. D-gate 1109 decompresses the quad-state VO1 signal output from QSM 1104 into the DO2 and DO3 signal pair for input to the two state signal destination 1011. When clocked, the quad-state circuit 1300 duplicates the operation of the conventional circuit 1200.

Serial Input/Parallel Output (SIPO) Circuit Example

Figure 14:
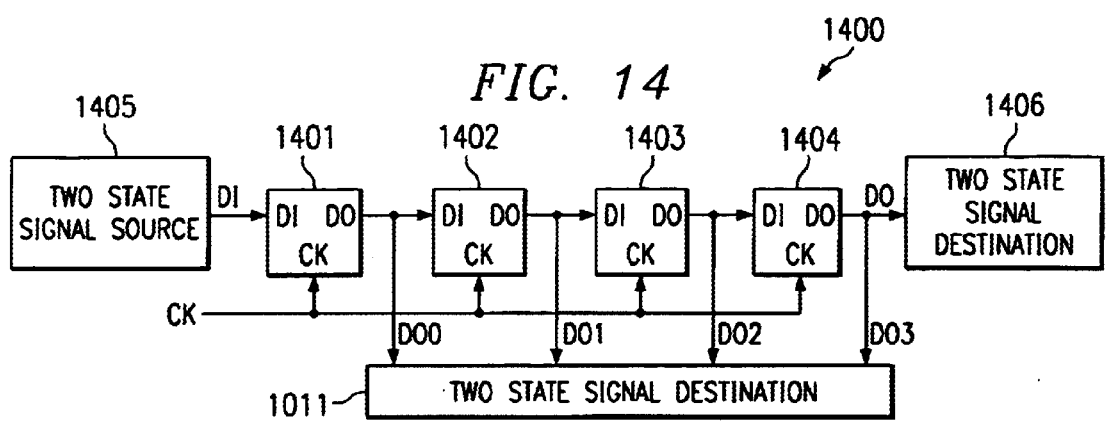
FIG. 14 illustrates an example of a conventional two-state serial input parallel output (SIPO) circuit arrangement.

FIG. 14 illustrates a conventional two-state SIPO circuit 1400 example whereby DI0–3 two-state signals, shifted into D-flip flops 1401–1404 from a two-state signal source 1405, are input to a two-state signal destination 1011, via the DO0–DO3 signals. Circuit 1400 also operates to shift two-state signals from the two-state signal source, through D flip flops 1401–1404, to the two-state signal destination 1406.

Figure 15A:
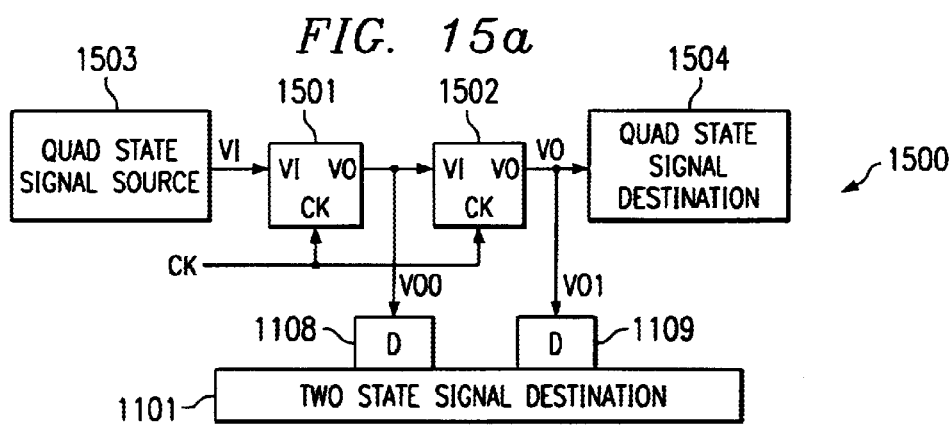
FIGS. 15A–15F illustrate an example implementation of a quad-state SIPO circuit arrangement according to the invention that could be functionally substituted for the conventional two-state SIPO circuit arrangement of FIG. 14.

FIG. 15A illustrates an equivalent quad-state SIPO circuit 1500 of the two-state SIPO circuit 1400. Circuit 1500 operates to shift in quad-state signals to QSMs 1501 and 1502 from quad-state signal source 1503 and input the shifted in quad-state signals to D-gates 1108 and 1109 to be decompressed into DO0–DO3 two-state signals for input to two-state signal destination 1011. Circuit 1500 also operates to shift quad-state signals from the quad-state signal source, through QSMs 1501 and 1502, to the quad-state signal destination 1504.

Figure 15B:
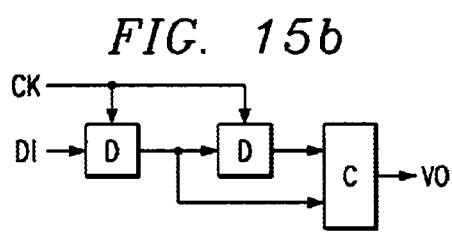
Figure 15C:
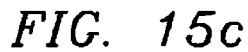
Figure 15D:
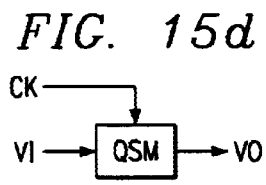

Quad-state signal source 1503 could be any type of circuit that outputs quad-state signals, or it could be integrated circuit pads which are used to input quad-state signals to the integrated circuit. FIG. 15B illustrates an example two-state to quad-state converter circuit that could be used as the quad-state signal source 1503. The two-state to quad-state converter circuit operates to shift in, from DI, 2 two-state signals to two serially connected D flip flops. Once shifted in, the 2 two-state signals are input to a C-gate to be compressed into a VO quad-state signal representation that is input to QSM 1501 via VI. FIG. 15C illustrates an example where an integrated circuit pad is used as the quad-state signal source 1503, to directly input quad-state signals to QSM 1501. FIG. 15D illustrates that the quad-state signal source 1503 could be another QSM 100 which supplies the VI input to QSM 1501.

Figure 15E:
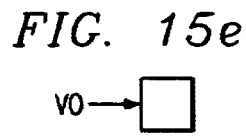
Figure 15F:
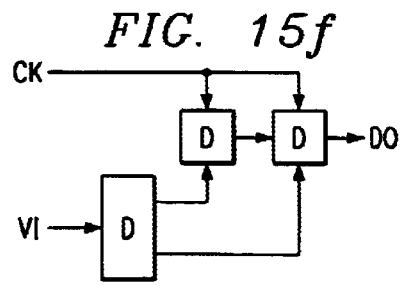

Quad-state signal destination 1504 could be any type of circuit that inputs quad-state signals, or it could be integrated circuit pads which are used to output quad-state signals from the integrated circuit. FIG. 15F illustrates an example quad-state to two-state converter circuit that could be used as the quad-state signal destination 1504. The quad-state to two-state converter circuit operates to input quad-state signals output from QSM 1502 to a D-gate to decompress the quad-state signals into 2 two-state signal representations. Once decompressed, the 2 two-state signals are parallel loaded into two serially connected D flip flops and shifted out via DO. FIG. 15E illustrates an example where an integrated circuit pad is used as the quad-state signal destination 1504, to directly output quad-state signals from QSM 1502. FIG. 15D illustrates that the quad-state signal destination 1504 could be another QSM 100 which receives the VO output from QSM 1502.

Parallel Input/Serial Output (PISO) Circuit Example

FIG. 16 illustrates a conventional two-state PISO circuit 1600 example whereby DI0–3 two-state signals, parallel loaded into D-flip flops 1401–1404 from a two-state signal source 1001, are shifted out to a two-state signal destination 1406. Circuit 1600 also operates to shift two-state signals from the two-state signal source 1405, through D flip flops 1401–1404, to the two-state signal destination 1406. Multiplexers (M) 1601–1604 are associated with the inputs of D flip flops 1401–1404 to provide the parallel load and shift path connections. Multiplexers 1601–1604 are controlled by a select (S) control input.

FIG. 17A illustrates an equivalent quad-state PISO circuit 1700 of the two-state PISO circuit 1600. Circuit 1700 operates to parallel load the quad-state signal outputs (VI0 and VI1) from C-gates 1101 and 1102 into QSMs 1501 and 1502. VI0 and VI1 are the compressed signal representations of the DI0 and DI1, and DI2 and DI3 signals, respectively, from two-state signal source 1001. Following the parallel load, The VI0 and VI1 signals are shifted out to the quad-state signal destination 1504. Circuit 1700 also operates to shift quad-state signals from the quad-state signal source 1503, through QSMs 1501 and 1502, to the quad-state signal destination 1504. Multiplexers (M) 1701 and 1702 are associated with the inputs of QSMs 1501 and 1502 to provide the parallel load and shift path connections. Multiplexers 1701 and 1702 are controlled by a select (S) control input. Since multiplexers 1701 and 1702 must pass quad-state voltage levels, instead of two-state voltage levels as with multiplexers 1601–1604, they are preferably implemented using the T-gate signal multiplexing arrangement shown in FIG. 17B.

Figure 18:
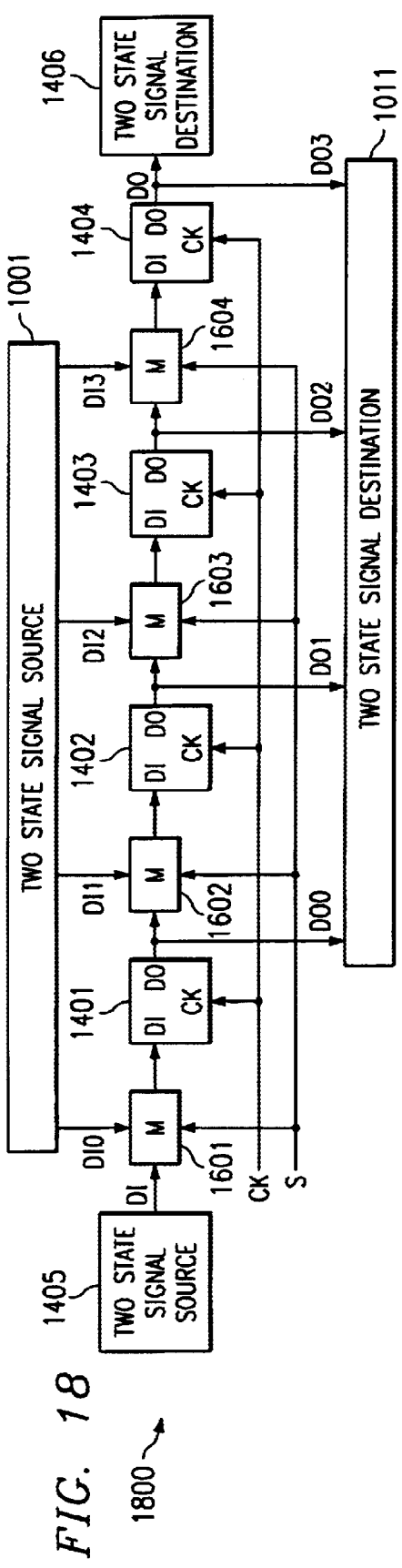
FIG. 18 illustrates an example of a conventional two-state PISO/SIPO circuit arrangement.

Parallel Input/Serial Output & Serial Input/Parallel Output (PISO/SIPO) Circuit Example FIG. 18 illustrates a conventional two-state PISO/SIPO circuit 1800 example. In a first operation mode, DI0–3 two-state signals are parallel loaded into D-flip flops 1401–1404 from a two-state signal source 1001 and shifted out to a two-state signal destination 1406. In a second operation mode, two-state signals are shifted into D flip flops 1401–1404 from a two-state signal source 1405 and parallel input, as DO0–DO4, to a two state signal destination 1011.

The first and second operation modes can be overlapped such that both operation modes can occur simultaneously. Circuit 1800 also operates to shift two-state signals from the two-state signal source 1405, through D flip flops 1401–1404, to the two-state signal destination 1406. Multiplexers 1601–1604 provide the parallel load and shift path connections.

Figure 19:
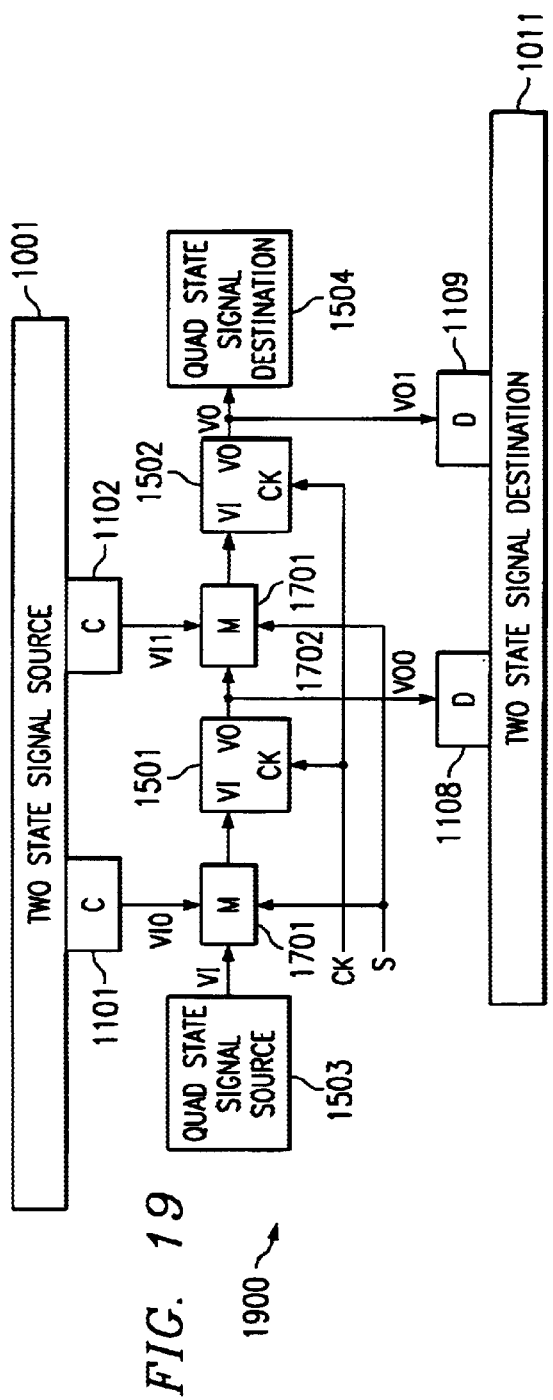
FIG. 19 illustrates an example implementation of a quad-state PISO/SIPO circuit arrangement according to the invention that could be functionally substituted for the conventional two-state PISO/SIPO circuit arrangement of FIG. 18.

FIG. 19 illustrates an equivalent quad-state PISO/SIPO circuit 1900 example. In a first operation mode, VI0 and VI1 quad-state signals are parallel loaded into QSMs 1501 and 1502 from a C-gates 1101 and 1102, respectively, and shifted out to a quad-state signal destination 1504. VI0 and VI1 are the compressed signal representations of the DI0 and DI1, and DI2 and DI3 signals, respectively, from two-state signal source 1001. In a second operation mode, quad-state signals are shifted into QSMs 1501 and 1502 from a quad-state signal source 1503 and parallel input, as VO0 and VO1, to D-gates 1108 and 1109 where they are decompressed into DO0 and DO1, and DO2 and DO3 signals, respectively, and input to a two-state signal destination 1011. The first and second operation modes can be overlapped such that both operation modes can occur simultaneously. Circuit 1900 also operates to shift quad-state signals from the quad-state signal source 1503, through QSMs 1501 and 1502, to the quad-state signal destination 1504. Multiplexers 1701 and 1702 provide the parallel load and shift path connections.

Finite State Machine (FSM) Circuit Example

Figure 20:
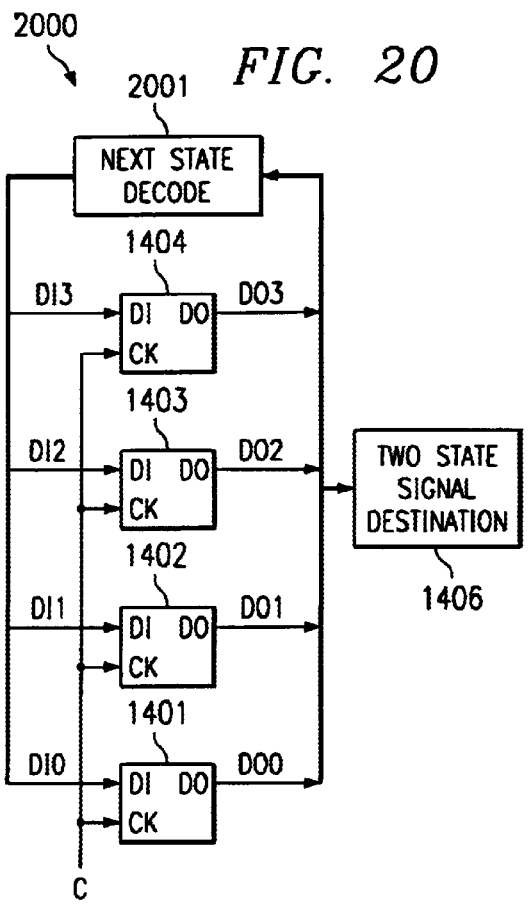
FIG. 20 illustrates an example of a conventional two-state finite state machine (FSM) circuit arrangement.

FIG. 20 illustrates a conventional two-state FSM circuit 2000 example. The two-state FSM comprises D-flip flops 1401–1404 and a next state decode circuit 2001. The two-state FSM operates, in response to the clock, to transition to a next state, as determined by the DI0–DI3 two-state outputs from next state decode circuit 2001, from a current present state, as determined by the DO0–DO3 two-state inputs to the next state decode circuit 2001. The present state outputs, DO0–DO3, are output from the two-state FSM to a two-state signal destination 1406.

Figure 21:
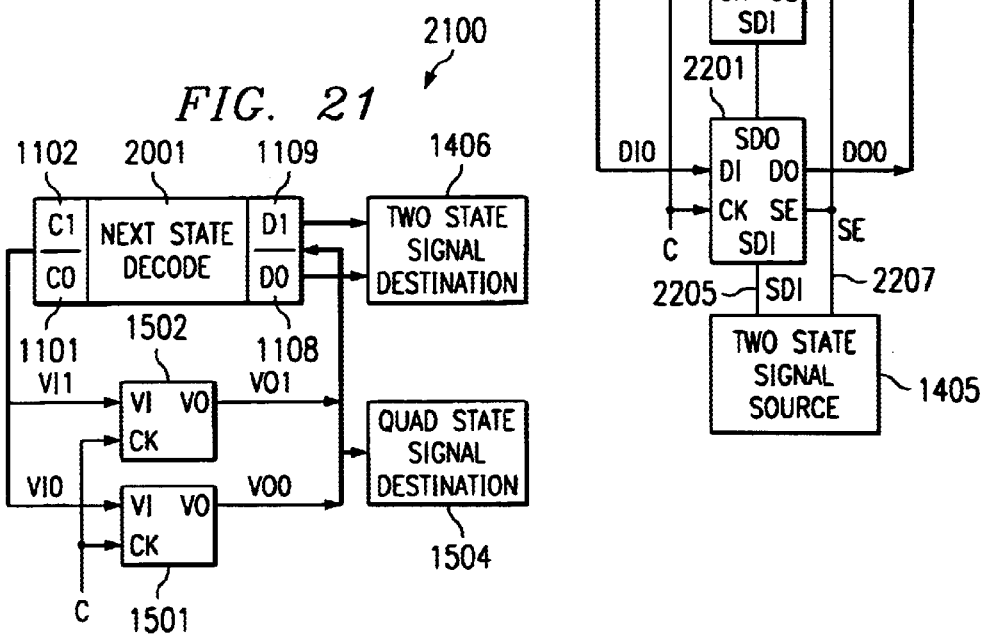
FIG. 21 illustrates an example implementation of a quad-state FSM circuit arrangement according to the invention that could be functionally substituted for the conventional two-state FSM circuit arrangement of FIG. 20.

FIG. 21 illustrates an equivalent quad-state FSM circuit 2100 example. The quad-state FSM comprises QSMs 1501 and 1502, next state decode circuit 2001, C-gates 1101 and 1102, and D-gates 1108 and 1109. D-gates 1108 and 1109 serve to decompress the present state quad-state signals VO0 and VO1 into two-state DO0 and DO1, and DO2 and DO3 signal pairs for input to the next state decode circuit 1001. C-gates 1101 and 1102 serve to compress the next state two-state DO0 and DO1 and DO2 and DO3 signal pairs from the next state decoder circuit 2001 into quad-state signals VO0 and VO1 for input to QSMs 1501 and 1502. The quad-state FSM operates, in response to the clock, to transition to a next state, as determined by the VI0 and VI1 quad-state outputs from C-gates 1101 and 1102, from a current present state, as determined by the VO0 and VO1 quad-state inputs to D-gates 1108 and 1109. The quad-state FSM provides both two-state and quad-state present state outputs. The present state quad-state outputs, VO0 and VO1, are output from the quad-state FSM to a quad-state signal destination 1504. The decompressed present state two-state outputs, DO0–DO3 are output from the D-gates 1108 and 1109 to two-state signal destination 1406.

Scan Testable Circuit Example

Figure 22:
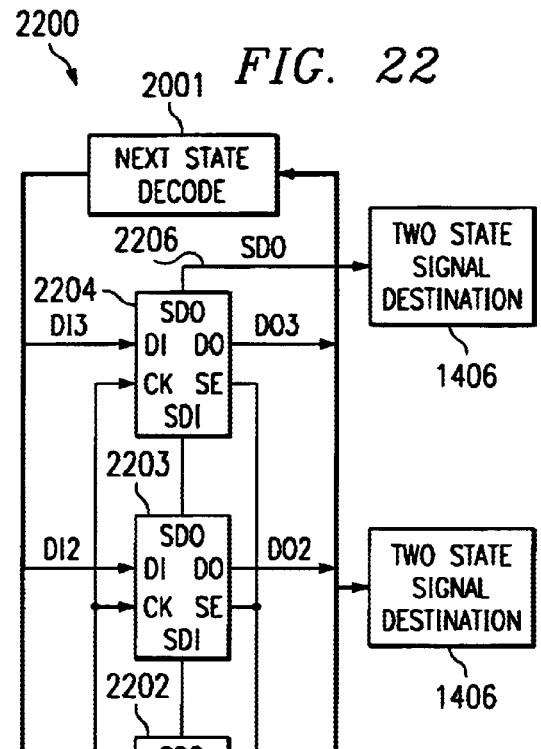
FIG. 22 illustrates an example of a conventional scan testable two-state circuit arrangement.

In FIG. 22 an example circuit 2200 depicts how the two-state FSM circuit 2000 of FIG. 20 is modified to be conventionally two-state scan testable. The modification includes removing D flips flops 1401–1404 from the circuit and replacing them with conventional scan testable D flip flops 2201–2204. The conventional scan testable D flip flops include, in addition to their DI, DO, and CK signals, a scan data input (SDI), scan data output (SDO), and scan enable (SE) signals. A more detailed example of a scan testable D flip flop is seen in 440 of FIG. 4. The SDI and SDO signals of each D flip flop are daisychained to form a scan path from a two-state signal source 1405 connected to the SDI 2205 input of D flip flop 2201 on through to a two-state signal destination 1406 connected to the SDO 2206 output of D flip flop 2204. The SE signals are bussed onto a common wire 2207 connected to a two-state signal source 1405 to allow all D flip flops to capture signals on their DI inputs at the same time, when SE is in a first state, and to allow all D flip flops to shift at the same time, when SE is in a second state. The test involves repeating the steps of; (1) shifting test two-state stimulus signals into D flip flops 2201–2204 and inputting the test stimulus signals to the next state decode circuit 2001, then (2) capturing two-state test response signals from next state decode circuit 2001 into D flip flops 2201–2204 and shifting the test response out of D flip flops 2201–2204. The shifting in of two-state test stimulus and shifting out of two-state test response occurs during the same shift operation. The test completes when all two-state test stimulus has been shifted in and input to the next state decode circuit and all two-state test response has been captured from the next state decode circuit and shifted out.

Figure 23:
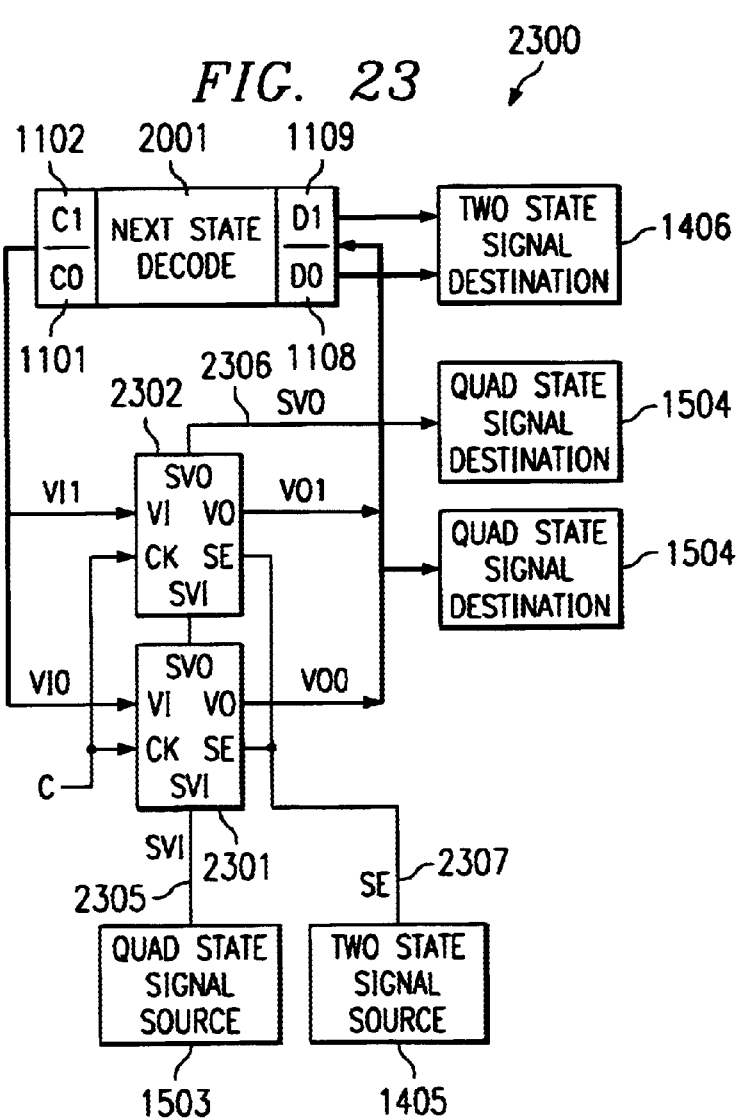
FIG. 23 illustrates an example implementation of a scan testable quad-state circuit arrangement according to the invention that could be functionally substituted for the conventional two-state circuit arrangement of FIG. 22.

In FIG. 23 an example circuit 2300 depicts how the equivalent quad-state FSM circuit 2100 of FIG. 21 is modified to be quad-state scan testable. The modification includes removing QSMs 1501 and 1502 from the circuit and replacing them with scan testable QSMs 2301 and 2302, as previously described in regard to QSM 400 of FIG. 4. QSMs 2301 and 2302 include, in addition to their VI, VO, and CK signals, a scan voltage input (SVI), scan voltage output (SVO), and scan enable (SE) signals. The SVII and SVO signals of each QSM are daisychained to form a scan path from a quad-state signal source 1503 connected to the SVI 2305 input of QSM 2301 to a quad-state signal destination 1504 connected to the SVO 2306 output of QSM 2302. The SE signals are bussed onto a common wire 2307 connected to a two-state signal source 1405 to allow all QSMs to capture signals on their VI inputs at the same time, when SE is in a first state, and to allow all QSMs to shift at the same time, when SE is in a second state. The test involves repeating the steps of; (1) shifting quad-state test stimulus signals into QSMs 2301 and 2302 and inputting the quad-state test stimulus signals to the next state decode circuit 2001, via D-gates 1108 and 1109 which decompress the quad-state signals into two-state signal representation, then (2) capturing quad-state test response signals from next state decode circuit 2001, via C-gates 1101 and 1102 which compress the two-state signals from circuit 2001 into quad-state representations, into QSMs 2301 and 2302 and shifting the quad-state test response out of QSMs 2301 and 2301. The shifting in of quad-state test stimulus and shifting out of quad-state test response occurs during the same shift operation. The test completes when all quad-state test stimulus has been shifted in and input to the next state decode circuit, via D-gates 1108 and 1109, and all quad-state test response has been captured from the next state decode circuit, via C-gates 1101 and 1102, and shifted out.

While the FIG. 23 example used a simple FSM to illustrate how quad-state scan testing occurs, it should be clear that much larger and more complex circuits, such as digital signal processors, micro-processors, and micro-controllers, can also use the quad-state scan testable feature provided by the present invention. As previously mentioned in regard to FIG. 4, quad-state scanning can reduce test times by up to one half, due to the fact that designs using quad-state memories (QSMs) instead of two-state memories (D flip flops) reduce the number of memories required to be scanned by one half. Having to scanning only one half the memories of a circuit and using the same scan clock frequency results in reducing test time by one half.

Quad-state signal source 1503, connected to SVI 2305, could be a pad input, as shown in FIG. 17C, for directly inputting quad-state test stimulus signals from a tester. Quad-state signal destination 1504, connected to SVO 2306, could b a pad input, as shown in FIG. 17E, for directly outputting quad-state test response signals to a tester. Alternately, quad-state signal source 1503, connected to SVI 2305, could be an internal quad-state signal generator circuit, and quad-state signal destination 1504, connected to SVO 2306, could be an internal quad-state signal compactor circuit. The quad-state generator circuit would operate to generate and supply quad-state test stimulus inputs, and the quad-state compactor circuit would operate to input and compact the quad-state test response outputs. The use of quad-state generator and compactor circuits provide the following novel quad-state built-in-self-test approach for circuits incorporating scan testable QSMs.

Quad-State Built-In-Self-Test (BIST) Example

Figure 24:
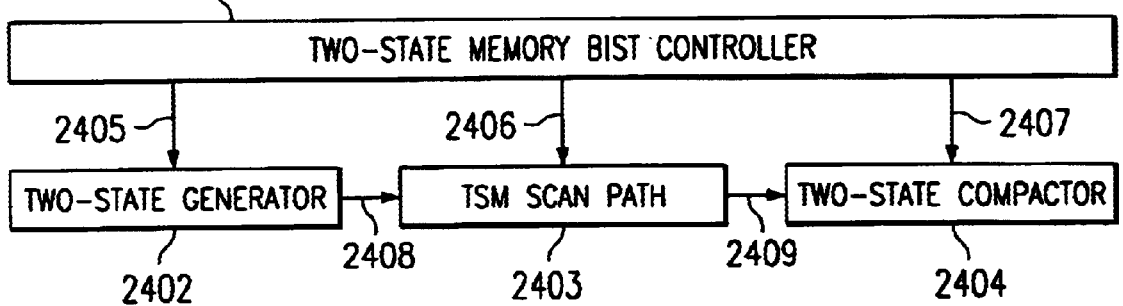
FIG. 24 illustrates an example of a conventional BIST testable two-state circuit arrangement.

In FIG. 24, conventional two-state BIST circuitry 2400 is shown consisting of a two-state memory BIST controller 2401, two-state generator 2402, two-state memory (TSM) scan path 2403, and two-state compactor 2404. Generator 2402 is typically designed as a linear feedback shift register. When operating, the linear feedback shift register outputs a pseudo-random sequence on connection 2408 which is input as test stimulus to the scan path 2403. Compactor 2404 is typically designed as a signature analysis register. When operating, the signature analysis register inputs test response from scan path 2403 on connection 2409 and compresses the test response into a signature. The controller 2401 operates to control the operation of the generator 2402, scan path 2403, and compactor 2404, via control inputs 2405, 2406, and 2407, respectively. Generator 2402 operates, in response control input 2405, to produce two-state test stimulus input to scan path 2403. Scan path 2403 operates, in response to control input 2406, to capture two-state test response from connected two-state circuitry, then shift out the two-state test response to the compactor 2404 while shifting in new two-state test stimulus from generator 2402. Compactor 2404 operates, in response to control input 2407, to compress two-state test response output from scan path 2403.

Applying the two-state BIST circuit 2400 to the two-state FSM 2200 of FIG. 22, the generator 2402 would form the two-state signal source 1405 connected to SDI 2205 in FIG. 22. Compactor 2404 would form the two-state signal destination 1406 connected to SDO 2206 in FIG. 22. Scan path 2403 would be the daisychained D flip flops 2201–2204 connected between SDI 2205 and SDO 2206. Controller 2401 would be connected to the SE and CK inputs of scan path 2403 of FIG. 22 to control the scan path's capture and shift operations. Controller 2401 would also be connected to the two-state signal source 1405 connected to SDI 2205, which contains generator 2402, and to the two-state signal destination 1406 connected to SDO 2206, which contains compactor 2404.

In FIG. 24, quad-state BIST circuitry 2500 is shown consisting of a quad-state memory BIST controller 2501, two-state generator 2402, two-state to quad-state converter 2504 of FIG. 15B, quad-state memory scan path 2503, quad-state to two-state converter 2505 of FIG. 15F, and two-state compactor 2404. The controller 2401 operates to control the operation of the generator 2402, converter 2504, scan path 2403, converter 2505, and compactor 2404, via control inputs 2505, 2507, 2508, 2509, and 2510, respectively. Generator 2401 operates, in response control input 2506, to produce two-state test stimulus input to converter 2504 via connection 2511. Converter 2504 operates, in response to control input 2507, to convert two-state test stimulus input from generator 2402 into quad-state test stimulus output to scan path 2503 via connection 2512. Scan path 2503 operates, in response to control input 2508, to capture quad-state test response from connected quad-state circuitry, then shift out the quad-state test response to converter 2505 via connection 2513 while shifting in new quad-state test stimulus from converter 2504 via connection 2512. Converter 2505 operates, in response to control input 2509, to convert quad-state test response output from scan path 2503 via connection 2513 into two-state test response input to compactor 2404 via connection 2514. Compactor 2404 operates, in response to control input 2510, to compress the two-state test response output from converter 2505.

Applying the quad-state BIST circuit 2500 to quad-state FSM 2300 of FIG. 23, the combination of generator 2402 and converter 2504 would form the quad-state signal source 1503 connected to SVI 2305 in FIG. 23. The combination of compactor 2404 and converter 2505 would form the quad-state signal destination 1504 connected to SVO 2306 in FIG. 23. Scan path 2503 would be the daisychained QSMs 2301 and 2302 connected between SVI 2305 and SVO 2306. Controller 2501 would be connected to the SE and CK inputs of scan path 2503 of FIG. 23 to control the scan path's capture and shift operations. Controller 2501 would also be connected to the quad-state signal source 1503 connected to SVI 2305, which contains generator 2402 and converter 2504, and to the quad-state signal destination 1504 connected to SVO 2306, which contains converter 2505 and compactor 2404.

The process of inputting quad-state test stimulus to scan path 2503 comprises the steps of; (1) issuing control on connections 2506 and 2507 to generator 2402 and converter 2504 to cause a pair of two-state data bits to be shifted into D flip flops 2515 and 2516, (2) convert the bit pair into a quad-state signal representation using C-gate 2517, (3) input the quad-state signal from C-gate 2517 to scan path 2503, (4) issue control on connection 2508 to cause the scan path to shift in the quad-state signal from C-gate 2517, (5) repeat steps 1 through 4 for each additional quad-state signal input required to fill the scan path 2503 with quad-state test stimulus, (6) input the quad-state test stimulus pattern to the quad-state circuitry connected to scan path 2503, and (7) repeat the above steps until all test stimulus patterns have been input to the connected quad-state circuitry being tested.

The process of outputting quad-state test response from scan path 2503 comprises the steps of; (1) decompressing the present quad-state signal output from scan path 2503 into a two-state signal pair representation using D-gate 2518, (2) inputting control on connection 2509 to cause the two-state signal pair output from D-gate 2518 to be loaded into D flip flops 2519 and 2520, (3) inputting control on connections 2509 and 2510 to cause the signal pair in D flips 2519 and 2520 to be shifted into compactor 2404 and compressed into a signature, (4) issuing control on 2508 to cause the next quad-state signal to be shifted to the output of scan path 2503, (5) repeat steps 1 through 4 for each additional quad-state signal output required to empty the scan path 2503 of quad-state test response, (6) issue control on connection 2508 to cause scan path 2503 to capture the next quad-state test response pattern from the quad-state circuitry being tested, and (7) repeat the above steps until all test response patterns from the quad-state circuitry being tested have been input to compactor 2404 and compressed into a final signature.

The steps of the input process may overlap to streamline the test stimulus input process. The steps of the output process may overlap to streamline the test response output process. The input and output process steps may overlap to streamline the overall input and output test process. Step 6 of the output process typically follows step 6 of the input process. While not shown, D flip flop 2520 of converter 2505 includes a multiplexer on its data input, as shown in circuit 440 of FIG. 4, to provide a first path for loading data from D-gate 2518 during output process step 2 and to provide a second path for shifting data in from D flip flop 2519 during output process step 3.

QSMs with Two-State Outputs

In FIG. 26, a QSM 2600 is shown. QSM 2600 is identical to QSM 100 of FIG. 1 with the exception that state output circuit 103 in QSM 100 has been removed in QSM 2600, and a D-gate 700 has been added to QSM 2600. The VI input of D-gate 700 is connected to the feedback output 120 of the state feedback circuit 102, and the DO0 and DO1 outputs of D-gate 700 are output from QSM 2600. D-gate 700 is connected to the 3V and 0V supplies. QSM 2600 differs from other QSMs in that it has a quad-state signal input (VI) and a two-state signal output pair (DO1:DO0).

Truth table 2660 indicates the operation of QSM 2600. In response to a clock pulse when VI=0V, D-gate 700 outputs L:L on DO1:DO0. In response to a clock pulse when VI=1V, D-gate 700 outputs L:H on DO1:DO0. In response to a clock pulse when VI=2V, D-gate 700 output H:L on DO1:DO0. In response to a clock pulse when VI=3V, D-gate 700 outputs H:H on DO1:DO0. These two-state signal pairs represent the B:A encoding convention of table 161 in FIG. 1.

In FIG. 27, a circuit example 2700 using the QSM 2600 is shown. The circuit example is identical in operation to the circuit example 1300 described in regard to FIG. 13. The only differences are; (1) QSMs 2801 and 2802 replace QSMs 1103 and 1104, respectively, in circuit 2700, (2) D-gates 1108 and 1109 are removed from circuit 2700, and (3) connections are formed in circuit 2700 between the DO0 and DO0 outputs from QSM 2801 and 2802 and two-state signal destination 1011. From this example circuit, it can be seen that embedding D-gate 700 into the QSM 2600 provides the following advantages. A first advantage is that it provides a higher performance QSM since the D-gate is connected directly to the output of the state feedback circuit 102, instead of to the VO output of the state output circuit 103, as seen in the connection between QSM 1105 and D-gate 1108 of FIG. 13. Removing the state output circuit 103 eliminates the signaling delay through the state output circuit 103 and thus the QSM 2600 has a faster clock to DO1:DO0 output transfer than the QSM 1105 and D-gate 1108 combination in FIG. 13. A second advantage is that it provides a lower circuit overhead QSM and D-gate combination, since the circuit overhead increase of including the D-gate 700 into QSM 2600 is offset by the decrease in circuitry overhead by the removal of the state output circuit 103. A third advantage is that it provides a QSM which directly converts signals from the quad-state domain to the two-state domain, and therefore simplifies circuit design since fewer design elements must be comprehended and connected together, i.e. the QSM and D-gate elements of FIG. 13.

QSMs with Quad-State and Two-State Outputs

In FIG. 28, a QSM 2800 is shown. QSM 2800 is identical to QSM 2600 of FIG. 26 with the exception that state output circuit 103 is included in QSM 2800 along with the D-gate 700. QSM 2800 therefore includes both the VI to VO memory function of QSM 100 in FIG. 1 and the VI to DO1:DO0 memory function of QSM 2600 of FIG. 26. The VI inputs of both the state output circuit 103 and D-gate 700 are connected to the feedback output 120 of the state feedback circuit 102. QSM 2800 differs from other QSMs in that it has a quad-state signal input (VI) and both a quad-state signal output (VO) and a two-state signal output pair (DO1:DO0).

Truth table 2860 indicates the operation of QSM 2800. In response to a clock pulse when VI=0V, D-gate 700 outputs L:L on DO1:DO0 and circuit 103 outputs 0V on VO. In response to a clock pulse when VI=1V, D-gate 700 outputs L:H on DO1:DO0 and circuit 103 outputs 1V on VO. In response to a clock pulse when VI=2V, D-gate 700 output H:L on DO1:DO0 and circuit 103 outputs 2V on VO. In response to a clock pulse when VI=3V, D-gate 700 outputs H:H on DO1:DO0 and circuit 103 outputs 3V on VO.

Figure 29:
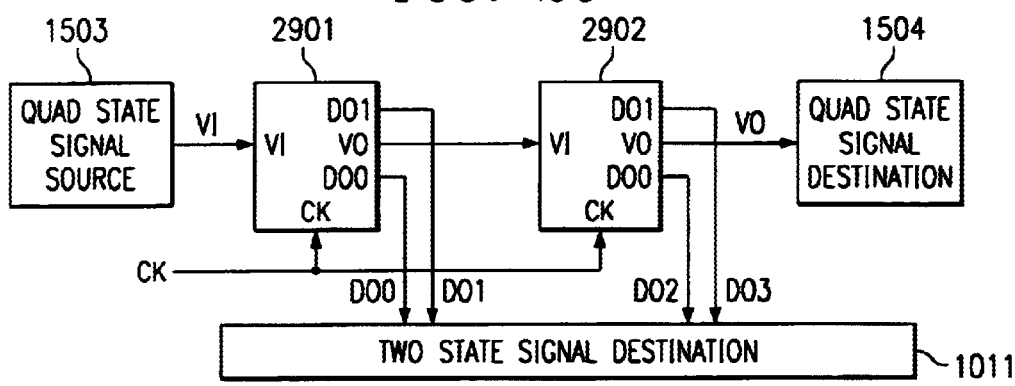
FIG. 29 illustrates an example implementation of the quad-state memory of FIG. 28 being used as registration between a quad-state signal source and a quad-state signal destination, and between the quad-state signal source and a two-state signal destination, according to the invention.

In FIG. 29, a circuit example 2900 using the QSM 2800 is shown. The circuit example is identical in operation to the circuit example 1500 described in regard to FIG. 15. The only differences are; (1) QSMs 2901 and 2902 replace QSMs 1501 and 1502, respectively, in circuit 2900, (2) D-gates 1108 and 1109 are removed from circuit 2900, and (3) connections are formed in circuit 2900 between the DO0 and DO1 outputs from QSM 2901 and 2902 and two-state signal destination 1011. Circuit example 2900 provides the first and third advantages stated for circuit example 2700. An advantage unique to the QSMs of circuit example 2900 is that drive capability of the QSMs DO1 and DO0 outputs can be increased to drive the potentially larger capacitive load of the two-state signal destination 1011, while the QSM VO drive capability can be potentially reduced, since the VO of a QSM 2800 may only drive the VI of another QSM 2800. Thus QSM 2800 allows scaling down the size of the VO drive transistors and scaling up the size of the DO0 and DO0 drive transistors, which reduce circuit overhead of QSM 2800. In contrast, the VO drive transistors of QSM 1501 needs to be scaled to a size that allows driving both the VI input of QSM 1502 and the input of D-gate 1108.

Quad-State Input and Output Pad Signaling

Figure 30:
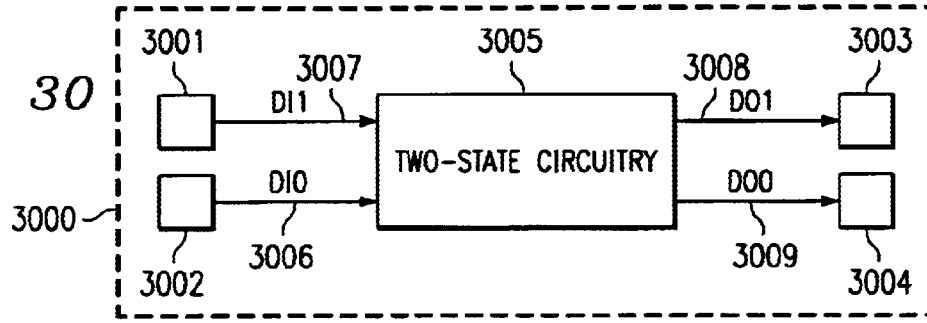
FIG. 30 illustrates an example of a conventional integrated circuit having two-state inputs and outputs coupled to two-state circuitry.

In FIG. 30 a conventional integrated circuit 3000 is shown comprising; two-state circuitry 3005, two-state input pads 3001 and 3002, two-state output pads 3003 and 3004, a connection 3007 between input pad 3001 and an input (DI1) to two-state circuitry 3005, a connection 3006 between input pad 3002 and an input (DI0) to two-state circuitry 3005, a connection 3008 between output pad 3003 and an output (DO10 from two-state circuitry 3005, and a connection 3009 between output pad 3004 and an output (DO0) from two-state circuitry 3005. Circuit 3005 could be any circuit type including; digital signal processors, micro-processors, micro-controllers, bus interface circuits, and RAM, ROM, FIFIO memories. The circuit 3005 inputs (DI0, DI1) and outputs (DO0, DO1) could be used for transmitting data, address, control, and clock signals. During operation it is assumed that, circuit 3005 inputs 100 Mhz two-state signals from pads 3001 and 3002 and outputs 100 Mhz two-state signal to pads 3003 and 3004.

Figure 31:
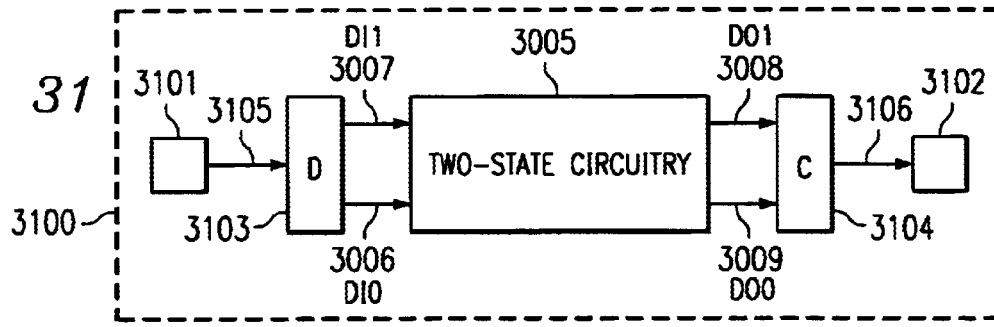
FIG. 31 illustrates an example implementation of an integrated circuit having quad-state inputs and outputs and two-state circuitry coupled to the quad-state inputs and outputs via a quad-state to two-state decompressor and a two-state to quad-state compressor, according to the invention.

In FIG. 31 the integrated circuit of FIG. 30 has been modified as follows. Two-state input pads 3001 and 3002 have been removed and in their place a quad-state input pad 3101 has been added and connected to the quad-state input of a D-gate 3103 via connection 3105. The two-state outputs of D-gate 3103 are connected to the two-state inputs of circuit 3005 via connections 3007 and 3006. Two-state output pads 3003 and 3004 have been removed and in their place a quad-state output pad 3102 has been added and connected to the quad-state output of a C-gate 3104 via connection 3106. The two-state inputs of C-gate 3104 are connected to the two-state outputs of circuit 3005 via connections 3008 and 3009. The operation of circuit 3005 in FIG. 31 is the same as in FIG. 30 in that, circuit 3005 inputs 100 Mz two-state data from D-gate 3103 which is driven by a 100 Mhz quad-state signal input at pad 3101, and outputs 100 Mhz two-state data to C-gate 3104 which drives out a 100 Mhz quad-state signal output at pad 3102.

Figure 32:
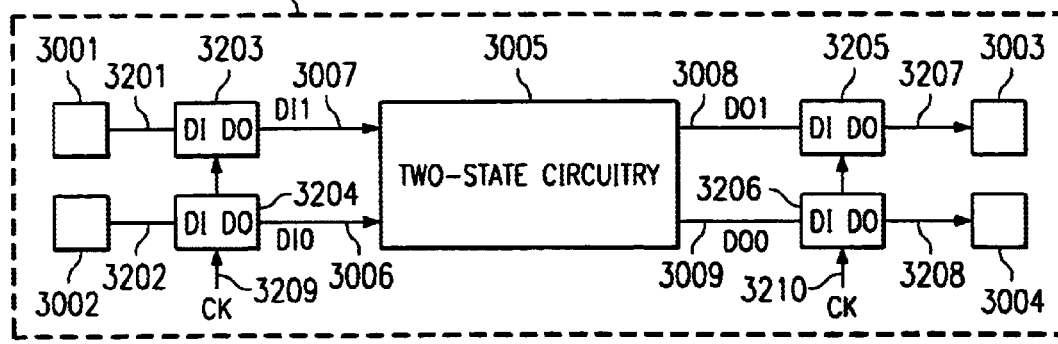
FIG. 32 illustrates an example of a conventional integrated circuit having registered two-state inputs and outputs coupled to two-state circuitry.

In FIG. 32 a conventional integrated circuit 3200 is shown comprising; two-state circuitry 3005, two-state input pads 3001 and 3002, two-state output pads 3003 and 3004, input D flip flops 3203 and 3204, output D flip flops 3205 and 3206, a connection 3007 between D flip flop 3203 and DI1 of circuit 3005, a connection 3006 between D flip flop 3204 and DI0 of circuit 3005, a connection 3201 between input pad 3001 and D flip flop 3203, a connection 3202 between input pad 3002 and D flip flop 3204, a connection 3008 between circuit 3005 and D flip flop 3205, a connection 3009 between circuit 3005 and D flip flop 3206, a connection 3207 between D flip flop 3205 and two-state output pad 3003, and a connection 3208 between D flip flop 3205 and two-state output pad 3004. D flip flops 3203 and 3204 are connected to a clock via connection 3209 and D flip flops 3205 and 3206 are connected to a clock via connection 3210. The clocks serve to synchronize or pipeline the data input and output of integrated circuit 3200. During operation it is assumed that, circuit 3005 inputs 200 Mhz two-state signals from pads 3001 and 3002, which are first registered in D flip flops 3203 and 3204 prior to being input to circuit 3005, and outputs 200 Mhz two-state signal to pads 3003 and 3004, which are first registered in D flip flops 3205 and 3206 prior to being output to pads 3003 and 3004. Integrated circuit 3200 is similar to integrated circuit 3000 with the exception that the inputs and outputs are piplelined via clocked input memories 3203 and 3204 and clocked output memories 3205 and 3206. Such input and output pipelining is conventionally used to improve the input and output bandwidth of circuits.

In FIG. 33 the integrated circuit of FIG. 32 has been modified as follows. Two-state input pads 3001 and 3002 have been removed and in their place a quad-state input pad 3101 has been added and connected to QSM 3301 (QSM 2600 of FIG. 26) via connection 3105. The two-state outputs of QSM 3301 are connected to the two-state inputs of circuit 3005 via connections 3007 and 3006. Two-state output pads 3003 and 3004 have been removed and in their place a quad-state output pad 3102 has been added and connected to the quad-state output of QSM 3302 (QSM 100 of FIG. 1) via connection 3106. The quad-state input of QSM 3302 is connected to the quad-state output of C-gate 3104 via connection 3303. The two-state inputs of C-gate 3104 are connected to the two-state outputs of circuit 3005 via connections 3008 and 3009. QSMs 3301 and 3302 are clocked via clock connections 3209 and 3210. The operation of circuit 3005 in FIG. 33 is the same as in FIG. 32 in that, circuit 3005 inputs 200 Mz two-state data representations from QSM 3301 as a result of the 200 Mhz quad-state signals input being clocked into QSM 3301 from pad 3101, and circuit 3005 outputs 200 Mhz two-state data to C-gate 3104 which outputs 200 Mhz quad-state signal representations to QSM 3303 which are clocked into QSM 3303 and output as 200 Mhz quad-state signals at pad 3102.

FIGS. 31 and 32 importantly illustrates the concept of quad-state signal communication occurring at the pads of integrated circuits 3100 and 3300. The conventional integrated circuits 3000 and 3200 use two-state input signaling on two input pads 3001 and 3002 and two-state output signaling on two output pads 3003 and 3004. Integrated circuits 3100 and 3300 duplicate the input and output functionality of integrated circuits 3000 and 3200, by using quad-state input signaling on one input pad 3101 and quad-state output signaling on one output pad 3102. Thus, using quad-state input and output signaling, integrated circuits 3100 and 3300 require only one half the signaling pads of integrated circuit 3000 and 3200, and, importantly, integrated circuits 3100 and 300 maintain the input and output bandwidth of integrated circuits 3000 and 3200.

While the integrated circuit examples in FIGS. 30–33 only show a minimum of inputs and outputs to circuit 3005 to simplify the concept, actual integrated circuits will have a far greater number of inputs and outputs which may be reduced by the use of quad-state signaling as described above. Also, while circuits 3000–3300 in FIGS. 30–33 were described as being integrated circuits, circuits 3000–3300 could represent intellectual property core circuits embedded within an integrated circuit as well. The same input and output terminal reduction and maintaining of bandwidth applies to intellectual property cores 3100 and 3300 when compared to conventional intellectual property cores 3000 and 3200, respectively.

The quad-state signaling connection between two integrated circuits or cores 3100 or 3300 would comprise forming a connection between the quad-state output pad or terminal 3102 of one of the integrated circuits or cores and the quad-state input pad or terminal 3101 of the other integrated circuit or core. If a connection is required where more that one quad-state signal transmitting device (integrated circuit or core) needs to communicate over the same connection to a quad-state signal receiving device, the quad-state outputs need to be provided with a 5-state output condition as previously described in regard to FIGS. 5 and 6. Use of 5-state outputs allows one device to transmit quad-state signals on the shared connection while the other device's quad-state output disable in the 5-state output condition. The 5-state output state described in FIG. 5 and 6 was related to QSM 500 which could be substituted for QSM 3302 of FIG. 33 to provide device 3300 with a 5-state output capability. FIG. 34 depicts a 5-state C-gate which could be substituted for C-gate 3104 of FIG. 31 to provide device 3100 with a 5-state output capability as well. In FIG. 34, C-gate 3400 is identical in operation to C-gate 800 of FIG. 8, with the exception that C-gate 3400 substitutes circuit 3401 for circuit 801 and an EN input is added and input to circuit 3401. As seen in truth table 3402, when the EN input is low, circuit 3401 outputs control C0–C3 to turn all the transistors of state output circuit 103 off, thus VO is placed in the non-driven 5-state output state. When EN is high, C-gate 3400 operates identically to C-gate 800. When 5-state QSMs 500 and C-gates 3400 are used in a device 3100 and 3300, the EN signal must be added and connected to QSMs 500 and C-gates 3400 to provide the control for placing their outputs in either the 4-state or 5-state modes.

I claim:

1. A memory for storing one of four voltage levels comprising:
   a first input for receiving one of said four voltage levels to be stored,
   a second input for receiving one of said four voltage levels to be stored,
   a third input for selecting between said first and second inputs,
   an output for transmitting one of said four voltage levels stored, and
   a clock input for controlling the store of one of said four voltage levels from one of said first and second inputs.

2. A scan test memory for storing one of four voltage levels comprising:
   a functional input for receiving one of said four voltage levels to be stored,
   a scan input for receiving one of said four voltage levels to be stored,
   a scan enable input for selecting between said functional and scan inputs,
   an output for transmitting one of said four voltage levels stored, and
   a clock input for controlling the store of one of said four voltage levels from one of said functional and scan inputs.

3. A scan testable circuit comprising;
   at least first and second memories each operable to store one of four voltage levels and each having a functional input, functional output, and a scan input,
   a connection formed between the functional output of said first memory and the scan input of said second memory, and
   circuitry to be tested, said circuitry having outputs connected to the functional inputs of said first and second memories and having inputs connected to the functional outputs of said first and second memories.

* * * * *